United States Patent
Hébert

(10) Patent No.: US 8,198,154 B2
(45) Date of Patent: Jun. 12, 2012

(54) METHOD OF FORMING BOTTOM-DRAIN LDMOS POWER MOSFET STRUCTURE HAVING A TOP DRAIN STRAP

(75) Inventor: François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/891,485

(22) Filed: Sep. 27, 2010

(65) Prior Publication Data

US 2011/0014766 A1    Jan. 20, 2011

Related U.S. Application Data

(62) Division of application No. 12/406,048, filed on Mar. 17, 2009, now Pat. No. 7,829,947.

(51) Int. Cl.
*H01L 21/8238* (2006.01)
*H01L 21/336* (2006.01)
*H01L 29/66* (2006.01)
*H01L 29/78* (2006.01)
*H01L 21/70* (2006.01)
*H01L 29/786* (2006.01)

(52) U.S. Cl. ........ 438/212; 438/197; 438/306; 438/307; 438/308; 257/328; 257/333; 257/337; 257/338; 257/339; 257/341; 257/343; 257/349; 257/492

(58) Field of Classification Search .............. 438/212
See application file for complete search history.

(56) References Cited

U.S. PATENT DOCUMENTS

| | | | |
|---|---|---|---|
| 5,113,236 A | 5/1992 | Arnold et al. | |
| 5,338,965 A | 8/1994 | Malhi | |
| 5,821,144 A | 10/1998 | D'Anna et al. | |
| 5,843,820 A | 12/1998 | Lu | |
| 5,869,875 A | 2/1999 | Hebert | |
| 6,130,458 A | 10/2000 | Takagi et al. | |
| 6,215,152 B1 * | 4/2001 | Hebert | 257/340 |
| 6,372,557 B1 | 4/2002 | Leong | |
| 6,791,143 B2 | 9/2004 | Baliga | |
| 6,800,897 B2 | 10/2004 | Baliga | |

(Continued)

OTHER PUBLICATIONS

"Comparative Study of Drift Region Designs in RF LDMOSFETs" to G. Cao et al., published in IEEE Electron Devices, Aug. 2004, pp. 1296-1303.
"A 2.45 GHz Power Ld-MOSFET with Reduced source inductance by V-Groove connections" to Ishiwaka O et al—published in International Electron Devices Meeting. Technical Digest, Washington DC, USA, Dec. 1-4, 1985, pp. 166-169.

(Continued)

*Primary Examiner* — Nathan W. Ha
*Assistant Examiner* — Michael Jung
(74) *Attorney, Agent, or Firm* — Joshua D. Isenberg; JDI Patent

(57) ABSTRACT

Lateral DMOS devices having improved drain contact structures and methods for making the devices are disclosed. A semiconductor device comprises a semiconductor substrate; an epitaxial layer on top of the substrate; a drift region at a top surface of the epitaxial layer; a source region at a top surface of the epitaxial layer; a channel region between the source and drift regions; a gate positioned over a gate dielectric on top of the channel region; and a drain contact trench that electrically connects the drift layer and substrate. The contact trench includes a trench formed vertically from the drift region, through the epitaxial layer to the substrate and filled with an electrically conductive drain plug; electrically insulating spacers along sidewalls of the trench; and an electrically conductive drain strap on top of the drain contact trench that electrically connects the drain contact trench to the drift region.

20 Claims, 32 Drawing Sheets

U.S. PATENT DOCUMENTS

| | | | |
|---|---|---|---|
| 6,987,052 B2 * | 1/2006 | Baiocchi et al. | 438/343 |
| 2001/0038112 A1 | 11/2001 | Gambino et al. | |
| 2006/0054958 A1 | 3/2006 | Weis et al. | |
| 2007/0013008 A1 | 1/2007 | Xu et al. | |
| 2007/0138548 A1 | 6/2007 | Kocon et al. | |
| 2007/0278571 A1 | 12/2007 | Bhalla et al. | |
| 2008/0023785 A1 | 1/2008 | Hebert | |
| 2009/0008691 A1 | 1/2009 | Lee et al. | |
| 2009/0302480 A1 | 12/2009 | Birner et al. | |

OTHER PUBLICATIONS

U.S. Appl. No. 12/406,048, filed Mar. 17, 2009.
Office Action dated Jan. 14, 2010 issued for U.S. Appl. No. 12/406,048.
Notice of Allowance and Fees Due dated Jun. 25, 2010 issued for U.S. Appl. No. 12/406,048.

* cited by examiner

METHOD OF FORMING BOTTOM-DRAIN LDMOS POWER MOSFET STRUCTURE HAVING A TOP DRAIN STRAP

CLAIM OF PRIORITY

This application is a divisional of and claims the priority benefit of commonly-assigned U.S. patent application Ser. No. 12/406,048 U.S. Pat. No. 7,829,947 entitled "BOTTOM-DRAIN LDMOS POWER MOSFET STRUCTURE HAVING A TOP DRAIN STRAP" to François Hébert, filed Mar. 17, 2009, the entire disclosures of which are incorporated herein by reference.

FIELD OF THE INVENTION

This invention generally relates to lateral metal oxide semiconductor field effect transistors (MOSFETs) and more particularly to high-performance lateral MOSFETs having a bottom drain electrode.

BACKGROUND OF THE INVENTION

Power MOSFETs have typically been developed for applications requiring power switching and power amplification. For power switching applications, the commercially available devices are typically double diffused MOSFETs (DMOS-FETs). Although a semiconductor power device with a planar gate structure is more compatible with multiple foundries and can be produced at a lower production cost, conventional technologies for manufacturing a MOSFET device with planar gates are still challenged by several technical difficulties and limitations. Referring to FIG. 1A, which is a cross-sectional view for a single cell 100 of a typical conventional vertical DMOS field effect transistor (FET) device configured with a planar structure having horizontal channel and gate, the channel is diffused from the edge of the source region near the gate. A DMOS FET typically includes a large number of such cells. The vertical FET structure of the cell 100 is formed on an N+ substrate 102, which acts as a drain region. An N-Epitaxial (epi) or N-drift 104 is located on top of the substrate 102. The structure 100 also includes a P-body region 106, an N+ source region 108, a N+ polysilicon gate region 112 and a gate oxide 110 disposed under the N+ gate 112. The transistor cell 100 in the example shown in FIG. 1A is an n-channel MOSFET (NMOSFET). A JFET implant, e.g., a N-type dopant implant for a NMOSFET device, may be used to reduce an increase of the on-resistance $R_{dson}$ caused by the lateral pinching by the body regions 106 of the drift region 104 between the channel regions 106. However, such a device has limited high frequency applications at a low bias due to the high gate-to-drain capacitance caused by the coupling of the planar gates to drain across the epitaxial and drift regions between the body regions. A JFET implant may be used to reduce the Rdson will increase the gate-drain capacitance.

Furthermore, a DMOS device with planar gate is limited by several technical limitations that the cell pitch cannot be easily reduced. Specifically, in reducing a cell pitch of a DMOS device, a small distance between the body regions causes a high drain to source on-resistance $R_{ds-on}$. Baliga disclosed in U.S. Pat. No. 6,800,897 and U.S. Pat. No. 6,791,143 a SSCFET (Silicon Semiconductor Corporation FET) device as shown in FIG. 1B, which illustrates a cross-sectional view of a SSCFET cell structure 120. For an n-channel MOSFET device, the SSCFET cell structure 120 is implemented with a deep retrograde N-type implant region 114 to improve device on resistance. The JFET implant region 114 is further combined with a buried P-region 116 disposed beneath the P-body region 106 to shield a shallow "conventional" laterally diffused channel. However, the SSCFET structure as shown in FIG. 1B does not provide an effective resolution to the above-described technical difficulties due to competing design requirements. Specifically, a high dose JFET implant for the purpose of achieving a lower resistance also compensates the P-body and the P-shield implant regions. It is also difficult to optimize and manufacture the SSCFET cell structure. For these reasons, demands for a high performance power device with high efficiency that is suitable for high frequency applications cannot be satisfied by semiconductor power devices with planar gates as produced by conventional technologies.

US publication No. 2007/0278571 discloses a cross-sectional view of a planar split-gate MOSFET device 130 as shown in FIG. 1C. The planar split-gate MOSFET device 130 is supported on a substrate 102 formed with an epitaxial (epi) layer 104. The MOSFET device 130 includes a split gate 132 with a gap g. The split gate 132 is disposed above a gate oxide layer 110 formed on top of the epitaxial layer 104. The MOSFET device further includes a shallow surface doped region 134 immediately below the gate oxide layer 110 to form a channel region. A vertical and deep JFET diffusion region 138 such as an N+ diffusion region is formed in the epitaxial layer 104 under the gap g of the split gate 132. This N+ region 138 counter-dopes the shallow surface doped layer and links the end of channel to the drain by extending from the top surface of epitaxial layer 104 to a bottom that is deeper than the bottom of a deep body region 136. The deep body regions 136 is doped with a dopant of second conductivity type, e.g., P-type dopant, extends from the bottom of shallow surface doped region 134 to a depth that is shallower than the bottom of deep JFET diffusion region 138. The P-body regions 136 encompassing a source region 108 doped with the dopant of first conductivity, e.g., N+ dopant. The source regions 108 counter-doping the shallow surface doped layer 134 are formed near the top surface of the epitaxial layer surrounding the JFET regions 138 formed underneath the gap of the split gates 132. The planar split-gate MOSFET structure shown in FIG. 1C has low gate-drain capacitance, since there is no gate electrode directly above the JFET diffusion 138. However these devices suffer from JFET pinching due to the current path running between body regions.

Lateral DMOS devices with grounded/substrate source of the prior art include P+ sinker or a trench used to connect the top source to the P+ substrate. "Comparative Study of Drift Region Designs in RF LDMOSFETs" to G. Cao et al., published in IEEE Electron Devices, August 2004, pp 1296-1303, discloses a cross-sectional view of a RF lateral DMOS device 150 device with grounded/substrate source as shown in FIG. 1D. The RF LDMOS device 150 is supported on a P+ substrate (source) 152 formed with a P– epitaxial layer 154 over it. The RF LDMOS device 150 includes P+ sinker 155 or a trench to connect top source metal 162 to the P+ substrate (source) 152. The top source metal 162 shorts the P+ sinker to the N+ top source region 159 through an opening in the oxide layer 160. A N+ drift region 156 is located at the top surface of the epitaxial layer 154 leading to the N+ drain region 158. A gate 166 is disposed above the N+ drift layer 156 and is electrically isolated by oxide 160. Top source metal 162 and drain metal 164 are disposed on top of the structure.

"A 2.45 GHz Power Ld-MOSFET with Reduced source inductance by V-Groove connections" to Ishiwaka O et al—published in International Electron Devices Meeting. Technical Digest, Washington D.C., USA, Dec. 1-4, 1985, pp.

166-169—discloses a LD-MOSFET with V-grooved source connections to minimize the source inductance (Ls), the gate-to-drain capacitance ($C_{gd}$) and the channel length ($L_{eff}$). The V-grooves, which penetrates the P− type epitaxial layer and reach the P+ type substrate, are formed in the $SiO_2$ region just outside the active area. The N+ type source regions of the LD-MOSFET are directly connected to the V-grooves with metallization. The source inductance $L_s$ has become negligibly small because the device does not require the bonding wires for the source. The $C_{gd}$ has also become a quarter that of the VD-MOSFET with the same gate width.

U.S. Pat. No. 6,372,557 discloses a method for forming a lateral DMOS transistor comprises: a) forming a first doped region of a first conductivity type in a semiconductor substrate of the first conductivity type; b) forming an epitaxial layer on the substrate; c) forming a second doped region of the first conductivity type in the epitaxial layer; and d) forming a body region of the first conductivity type in the epitaxial layer. The process of forming the first and second doped regions and the body region includes thermally diffusing dopants in these regions so that the first and second doped regions diffuse and meet one another. The body region also meets and contacts the second doped region. The body region is electrically coupled to the substrate via the first and second doped regions. Source and drain regions are then formed in the epitaxial layer. By forming the transistor in this manner, the electrical resistance between the body region and substrate can be reduced or minimized. Also, the size of the transistor can be reduced, compared to prior art lateral DMOS transistors. In essence, this type of device uses a buried layer to form a part of the sinker region which connects the bottom source to the top of the device.

U.S. Pat. No. 5,821,144 discloses an insulated gate FET (IGFET) device (lateral DMOS transistor) with reduced cell dimensions which is especially suitable for RF and microwave applications, includes a semiconductor substrate having an epitaxial layer with a device formed in a surface of the epitaxial layer. A sinker contact is provided from the surface to the epitaxial layer to the substrate for use in grounding the source region to the grounded substrate. The sinker contact is placed at the periphery of the die in order to reduce the pitch of the cell structure.

U.S. Pat. No. 5,869,875 discloses a lateral diffused MOS transistor formed in a doped epitaxial semiconductor layer on a doped semiconductor substrate includes a source contact to the substrate which comprises a trench in the epitaxial layer filled with conductive material such as doped polysilicon, a refractory metal, or a refractory silicide. By providing a plug as part of the source contact, lateral diffusion of the source contact is reduced, thereby reducing overall pitch of the transistor cell.

However, the use of a sinker or trench increases the pitch of the cell due to the dimensions of the sinker or trench. In addition, most of the lateral DMOS devices of prior art use the same metal over source/body contact region and gate shield region and some of them use second metal for drain and/or gate interconnect, which are unreliable due to hot carrier injection.

US publication 20080023785 discloses a bottom-source lateral diffusion MOS (BS-LDMOS) device. The device has a source region disposed laterally opposite a drain region near a top surface of a semiconductor substrate supporting a gate thereon between the source region and a drain region. The BS-LDMOS device further has a combined sinker-channel region disposed at a depth in the semiconductor substrate integrated with a body region disposed adjacent to the source region near the top surface wherein the combined sinker-channel region electrically connecting the body region and the source region to a bottom of the substrate functioning as a source electrode. A drift region is disposed near the top surface under the gate and at a distance away from the source region and extending to and encompassing the drain region. This device has a small cell pitch and achieves enhanced N-drift pinching on drain side to reduce hot carrier injection and gate-to-drain capacitance. However in this device and several of the previously described prior arts, the source is located at the bottom of the device, and is not suitable for certain applications which require the drain to be on the bottom.

US publication 20070013008 discloses a LDMOS device comprises a substrate having a first conductivity type and a lightly doped epitaxial layer thereon having an upper surface. Source and drain regions of the first conductivity type are formed in the epitaxial layer along with a channel region of a second conductivity type formed therebetween. A conductive gate is formed over a gate dielectric layer. A drain contact electrically connects the drain region to the substrate, comprising a first trench formed from the upper surface of the epitaxial layer to the substrate and having a sidewall along the epitaxial layer, a highly doped region of the first conductivity type formed along the sidewall of the first trench, and a drain plug in the first trench adjacent the highly doped region. A source contact is provided and an insulating layer is formed between the conductive gate and the source contact.

US publication 20070138548 discloses a LDMOS transistor device including a substrate having a first conductivity type with a semiconductor layer formed over the substrate. A source region and a drain extension region of the first conductivity type are formed in the semiconductor layer. A body region of a second conductivity type is formed in the semiconductor layer. A conductive gate is formed over a gate dielectric layer that is formed over a channel region. A drain contact electrically connects the drain extension region to the substrate and is laterally spaced from the channel region. The drain contact includes a highly-doped drain contact region formed between the substrate and the drain extension region in the semiconductor layer, wherein a topmost portion of the highly-doped drain contact region is spaced from the upper surface of the semiconductor layer. A source contact electrically connects the source region to the body region.

However, the devices described in US Patent Publications 20070013008, and 20070138548 include an N+ drain contact region formed by deep vertical connections. N+ drain sidewall diffusion is shown to extend only in a P− region, but not in an N-LDD (N− lightly doped drain) region. This lateral extension of the N+ drain dopant will reduce the breakdown voltage (BV) by reducing the N-LDD lateral length. In addition, this device is susceptible to hot carrier injection because of lack of "drain engineering" to pinch off LDD region at drain edge of the gate.

U.S. Pat. No. 5,113,236 discloses a silicon on insulator (SOI) of integrated circuit comprising a plurality of components typically adopted for high voltage application having a semiconductor substrate of a first conductivity type, an insulating layer provided on the substrate, a semiconductor layer provided on the insulating layer, a number of laterally separated circuit elements forming parts of a number of subcircuits provided in the semiconductor layer, a diffusion layer of a second conductivity type opposite to that of the first conductivity type provided in the substrate and laterally separated from all the other circuit elements and means for holding the diffusion layer at a voltage at least equal to that of the highest potential of any of the subcircuits present in the integrated device. However, SOI technology is not preferred because it is expensive and results in a higher thermal resistance. The higher thermal resistance occurs because the heat dissipated in the active transistor, has to go out from the substrate, and the buried oxide in SOI films will have a higher thermal resistance than a standard bulk wafer. Furthermore, deep sinker diffusions are used, which reach from the top of the wafer to the substrate, and these will result in the need for large lateral spacing between the sinker and the active devices, especially as the epi layer (or device layer in the case of SOI based devices) becomes thick.

U.S. Pat. No. 5,338,965 discloses an integrated circuit RESURF (REduced SURface Field) LDMOS (Lateral Double-diffused MOS) power transistor combining SOI (Silicon-On-Insulator) MOS technology with RESURF LDMOS technology. A SOI transistor and a RESURF drain region are coupled together on the same substrate to provide a source isolated high voltage power transistor with low "on" resistance. This allows the RESURF LDMOS transistor to be advantageously used in applications requiring electrical isolation between the source and substrate.

This design is characterized by large lateral dimensions because the drift region is in the bulk substrate. In addition, the type of device shown in U.S. Pat. No. 5,338,965 is not a "bottom drain" structure as may be seen from a brief review of the figures therein.

It would be desirable to develop a LDMOSFET device, with SOI versions, that includes a low gate-to-drain capacitance and gate charge with the drain connection at the bottom for low-side power conversion applications and does not suffer from a current-pinching effect (JFET resistance) caused by the drain current having to flow vertically between two adjacent body regions.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

FIGS. 2A-2D illustrate lateral DMOS devices with new drain contact structures.

Figure 1A:
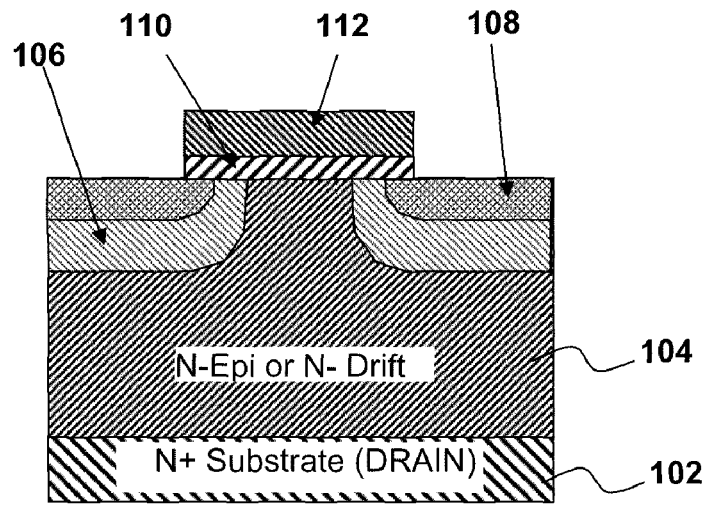
FIGS. 1A-1D are cross-sectional views of the lateral MOSFET structures of the prior art.
Figure 1B:
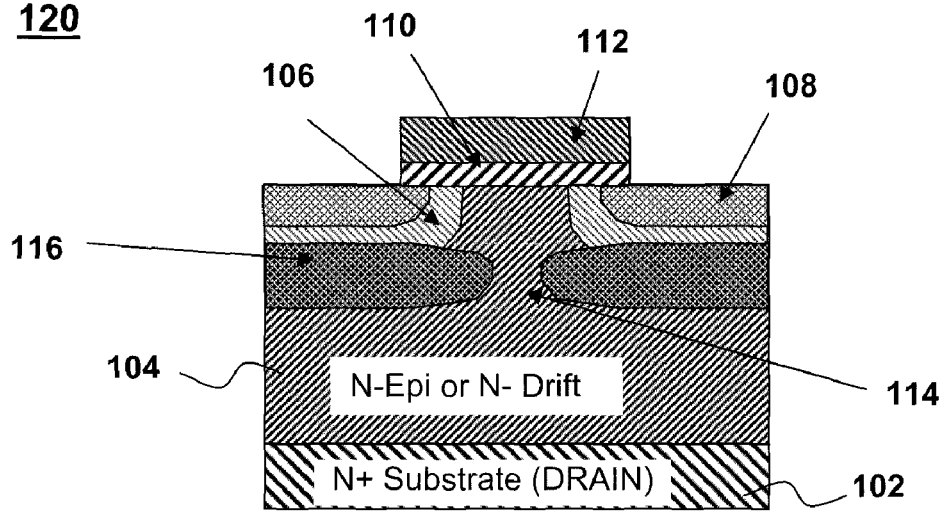
Figure 1C:
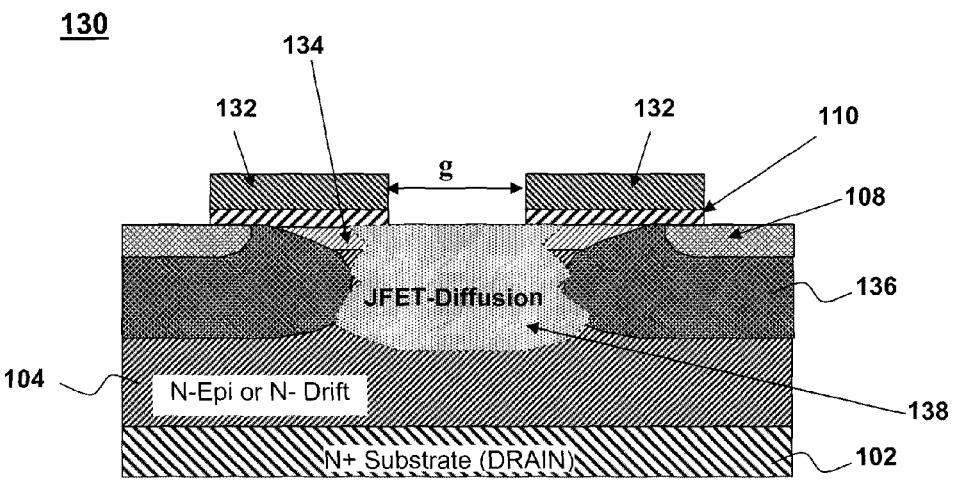
Figure 1D:
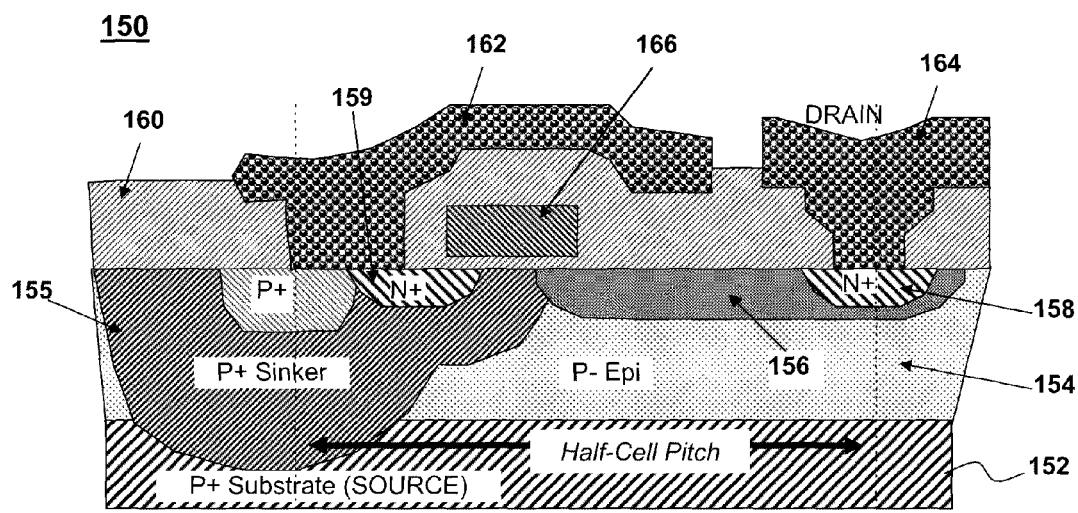
Figure 2A:
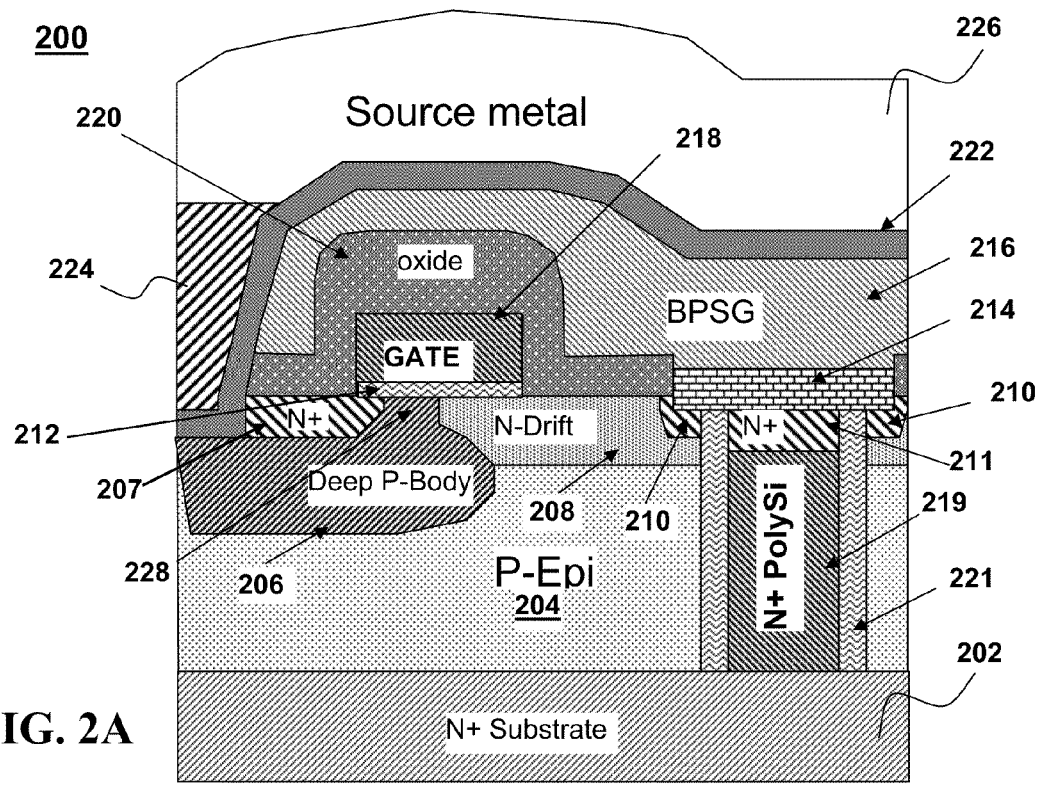
FIGS. 2A-2D are cross-sectional views of the lateral DMOS structures according to different embodiments of the present invention.

FIG. 2A is a cross-sectional view of a bottom-drain LDMOS device 200 according to an embodiment of the present invention. As shown in FIG. 2A, the LDMOS device 200 is supported on a semiconductor substrate 202, (e.g., an N+ substrate) which acts as a bottom drain. An epitaxial layer 204 of an opposite conductivity type to the substrate 202 (e.g., P-epitaxial (P-Epi)) is formed on the substrate 202. The device 200 includes a drift region 208 disposed at the top surface of the epitaxial layer 204. The drift region 208 is of the same conductivity type as the substrate 202 and of the opposite conductivity type to that of the epitaxial layer 204. For example if the substrate 202 is N-type and the epitaxial layer 204 is P-type, the drift region 208 may be N-type doped. For the sake of example, and not for the purposes of limitation of any embodiment of the invention, the following discussion assumes an N-type substrate.

The LDMOS device 200 includes a gate 218 disposed above a gate dielectric (e.g. oxide) layer 212 formed on top of the epitaxial layer 204. A deep P-Body region 206 is formed in the P-Epi layer 204 under the gate oxide 212 and under a source region 207 that lies partly under the gate oxide 212. The LDMOS device 200 further includes a portion of the body region 206 immediately below the gate oxide layer 212 that forms a channel region 228 which inverts when the gate is turned on to form an N-channel. A vertical drain contact trench, which is filled with an electrically conductive drain plug 219, e.g., doped N+ Polysilicon, is formed in the P-Epi layer 204 and is electrically isolated with the P-Epi layer 204 by sidewall oxide 221. The sidewall oxide 221 prevents dopant diffusion between the P-Epi layer 204 and the conductive drain plug 219. N+ drain contacts 210, 211 are located at the surface of the N-drift layer 208 and at the top of the drain plug 219 in the drain contact trench. The drain plug 219 may be electrically connected to the drain contacts 210 via the drain contact 211 and a metal silicide drain strap 214 disposed on top of the drain contact trench 219.

The gate 218 may be covered by oxide 220, which may, in turn, be covered with a BPSG layer 216. A barrier metal layer 222 covers the N+ source region 207 and the BPSG layer 216. The device 200 also includes a metal plug 224 (e.g., made of tungsten) and a source metal 226 positioned on top of the barrier layer 222.

Figure 2B:
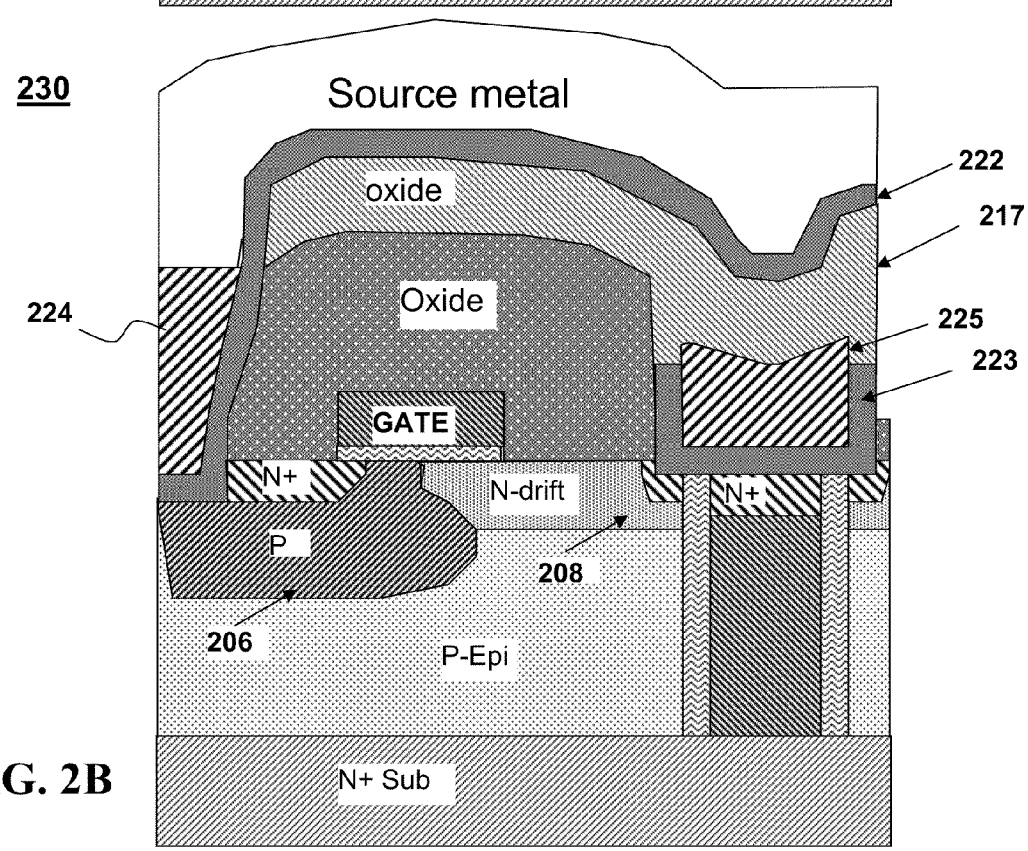

FIG. 2B is a cross-sectional view illustrating a LDMOS device 230 according to another embodiment of the present invention. The structure of the device 230 is similar to the structure of the device 200 as described in FIG. 2A, except the metal silicide drain strap 214 is replaced with a standard metal plug 225, e.g., made of tungsten, located on top of a diffusion barrier metal 223. The barrier metal 223 may be made, e.g., of titanium nitride (TiN).

Figure 2C:
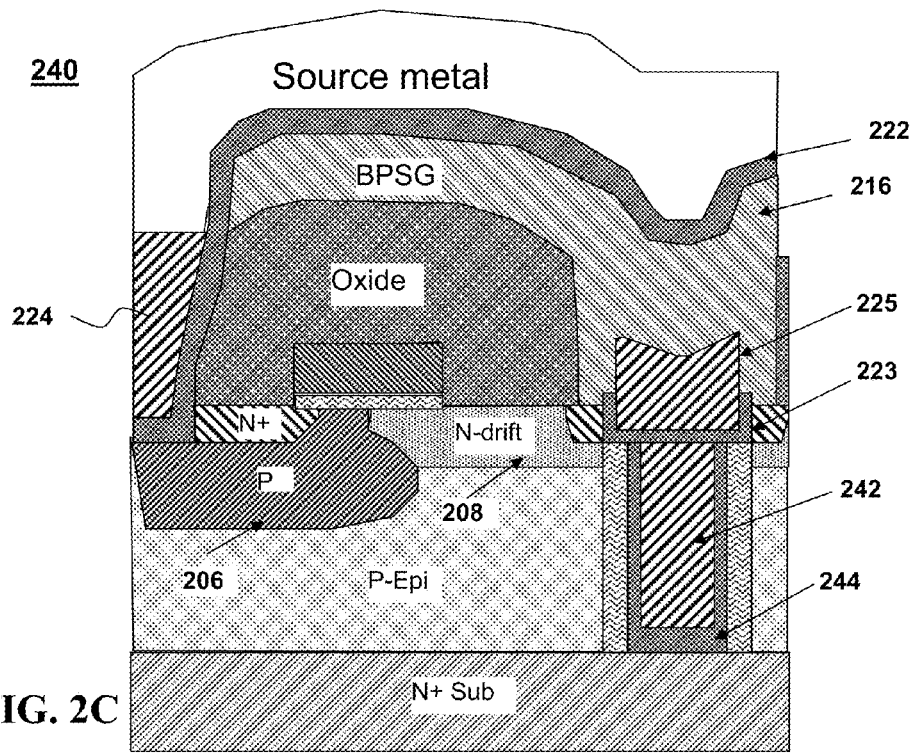

FIG. 2C is a cross-sectional view illustrating a LDMOS device 240 according to another embodiment of the present invention. As shown in FIG. 2C, the structure of the LDMOS device 240 is similar to the structure of the device 230 described in FIG. 2B, except the drain contact trench is also filled with a metal plug 242 (e.g., made of tungsten) located on top of a barrier metal 244, which may be made, e.g., of titanium nitride (TiN).

Figure 2D:
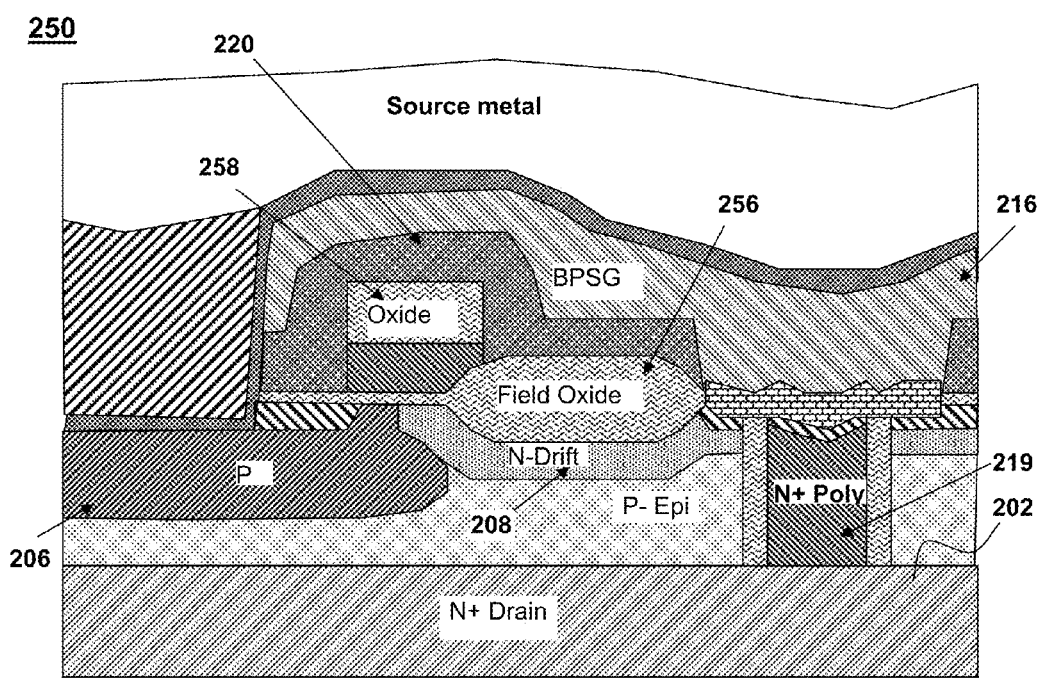

FIG. 2D is a cross-sectional view illustrating a LDMOS device 250 according to another embodiment of the present invention. The structure of device 250 is similar to the structure of the device 200 described in FIG. 2A, except the device 250 also includes a field oxide layer 256 located over an extended drift-drain extension region 208 between the P-body region 206 and the drain plug 219. In addition, the device 250 includes an oxide layer 258 located on top of the gate 218, the source 207 and the field oxide 256. In an alternative embodiment, the metal silicide drain strap 214 may be replaced with a standard TiN/W plug as shown in FIG. 2B. In another alternative embodiment, the drain contact trench 219 may be filed with W plug as described in FIG. 2C.

FIGS. 3A-3E illustrate examples of LDMOS devices having a LDMOS structure similar to that described above with respect to FIGS. 2A-2D formed in a Silicon on Insulator (SOI) substrate.

Figure 3A:
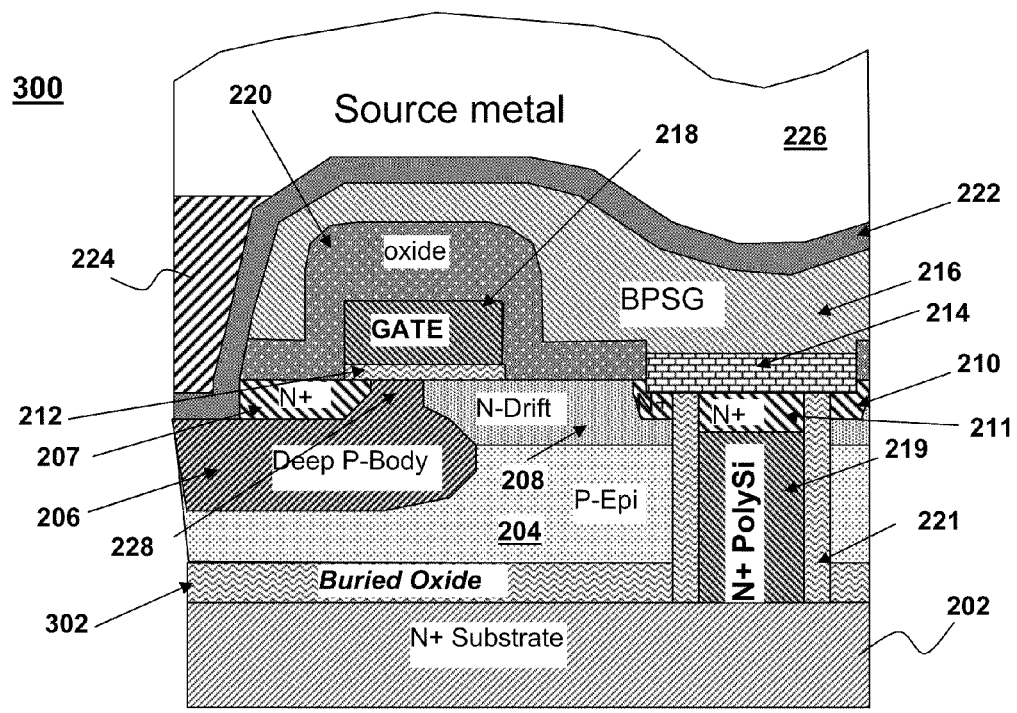
FIGS. 3A-3E are cross-sectional views of lateral DMOS devices with lateral DMOS structures of the types depicted in FIGS. 2A-2D formed in an SOI substrate.

FIG. 3A is a cross-sectional view illustrating a LDMOS device 300 according to an embodiment of the present invention. The structure of the device 300 is similar to the structure of the device 200 described above in FIG. 2A. As shown in FIG. 3A, the LDMOS device 300 is supported on a N+ substrate 202, which is a bottom drain, formed with an P-epitaxial (P-Epi) layer 204. In this embodiment, the device 300 includes a SOI substrate which includes a buried insulator layer 302 (e.g., an oxide layer) positioned between the P-Epi layer 204 and an N+ substrate 202.

A deep P-Body region 206 is formed in the P-Epi layer 204 under the gate oxide 212 and under a source region 207 that lies partly under the gate oxide 212. The device 200 includes N-drift layer 208 disposed at the top surface of the P-Epi layer 204. The LDMOS device 200 includes a gate 218 disposed above a gate oxide layer 212 formed on top of the epitaxial layer 204. The LDMOS device 200 further includes a portion of the body region 206 immediately below the gate oxide layer 212 to form a channel region 228. A vertical drain contact trench, which is filled with conductive material to form a conductive contact trench 219, e.g., doped N+ polysilicon, is formed in the P-Epi layer 204 and is electrically isolated with the P-Epi layer 204 by sidewall dielectric (e.g., oxide) 221, which may also act as a diffusion barrier. N+ drain contact regions 210, 211 are located at the surface of the N-drift layer 208 and at the top of the conductive material 219 in the drain contact trench. By way of example the sidewall oxide 221 may be formed as an oxide spacer.

The conductive material 219 in the drain contact trench may be connected to drain diffusion using a metal silicide drain strap 214 disposed on top of the conductive material 219. The gate 218 is covered by oxide 220, which is also covered with a BPSG layer 216. A conductive plug 224 (e.g., made of tungsten) is located adjacent to the source region 207 and body region 206. A barrier metal layer 222 covers the source region 207, body region 206, and the BPSG layer 216. The device 200 also includes a source metal 226 positioned on top of the barrier layer 222 and the conductive plug 224.

Figure 3B:
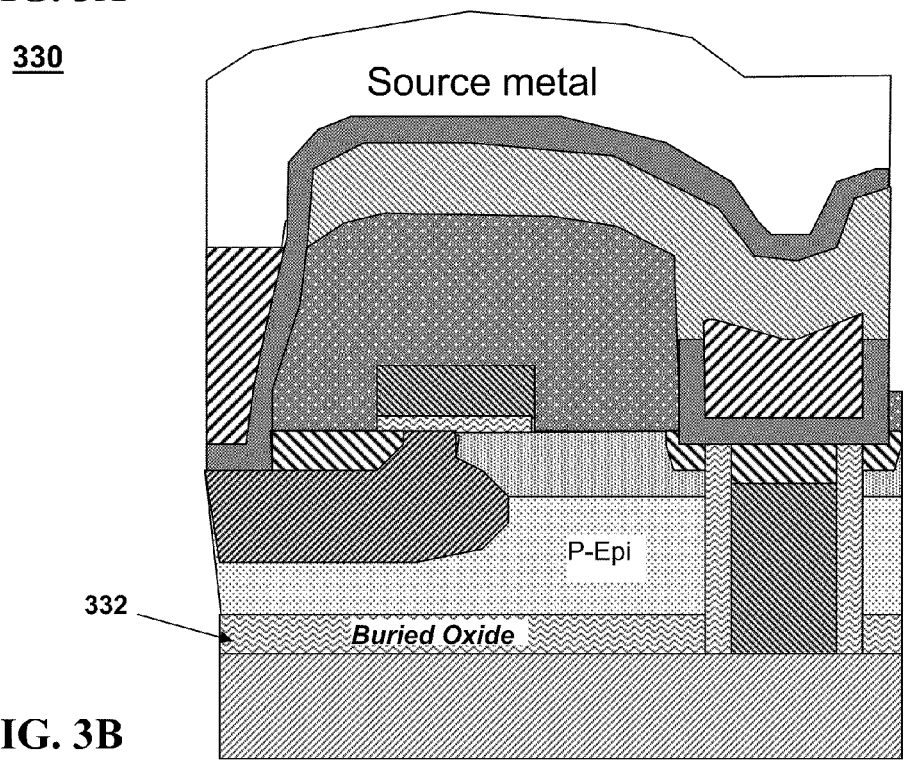

FIG. 3B is a cross-sectional view illustrating a LDMOS device 330 according to another embodiment of the present invention. The structure of the device 330 is similar to the structure of the device 230 as described above in FIG. 2B and further includes a SOI substrate which includes a buried oxide layer 332 positioned between the P-Epi layer 204 and the N+ substrate 202.

Figure 3C:
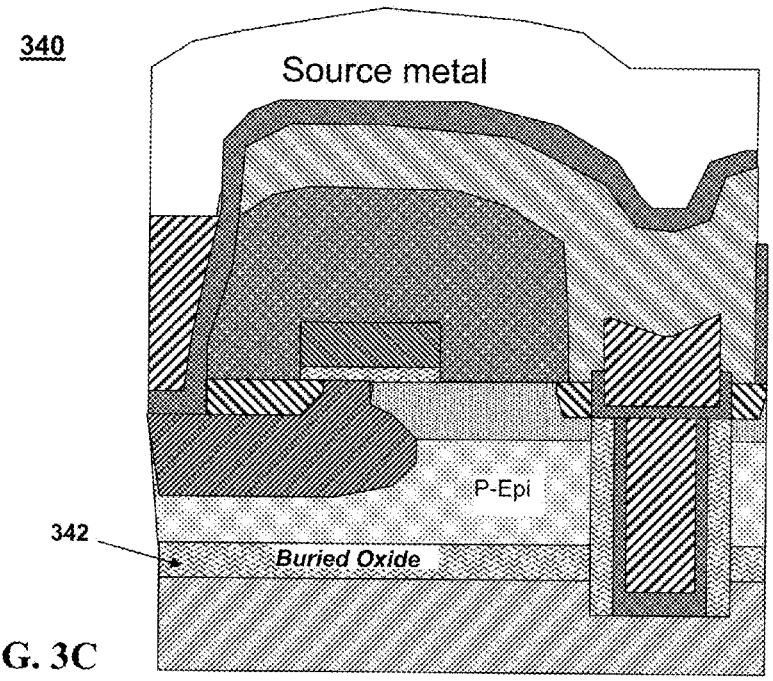

FIG. 3C is a cross-sectional view illustrating a LDMOS device 340 according to an embodiment of the present invention. The structure of the device 340 is similar to the device 240 as described above in FIG. 2C. The device 340 further includes a SOI substrate which includes a buried oxide 342 positioned between the P-Epi layer 204 and the N+ substrate 202.

Figure 3D:
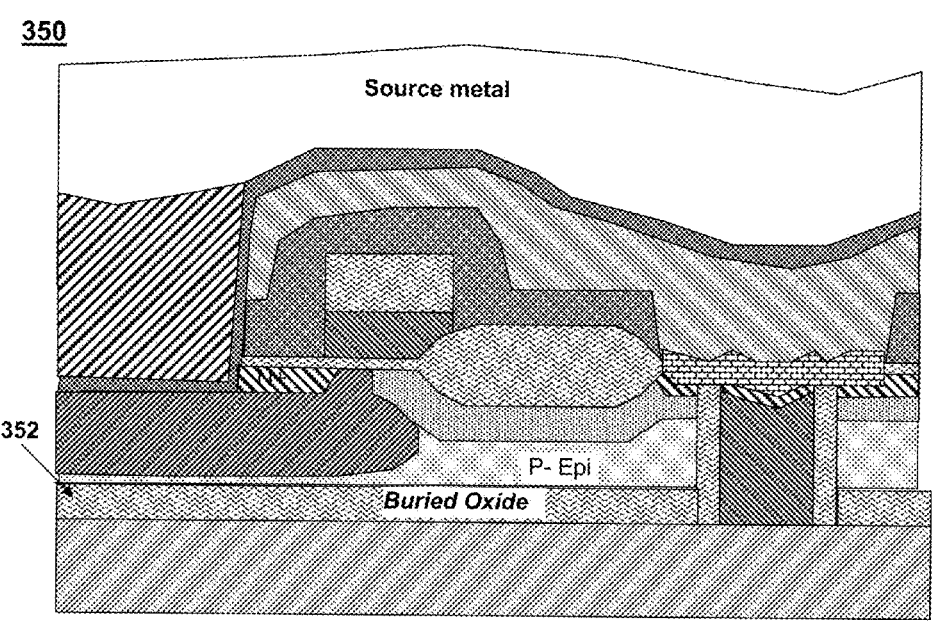

FIG. 3D is a cross-sectional view illustrating a LDMOS device 350. As shown in FIG. 3D, the structure of the device 350 is similar to the structure of the device 250 as described in FIG. 2D and further includes a buried oxide layer 352 positioned between the P-Epi layer 204 and the N+ substrate 202.

Figure 3E:
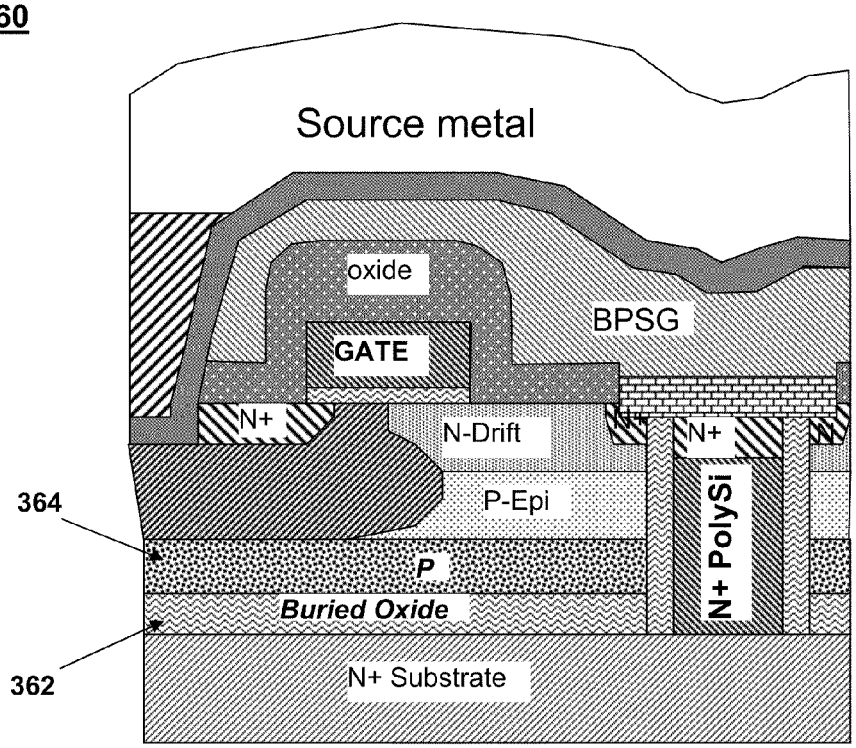

FIG. 3E is a cross-sectional view illustrating a LDMOS device 360 according to an embodiment of the present invention. The structure of the device 360 is similar to the structure of the device 300 described in FIG. 3A. In this embodiment, the SOI substrate includes the P-Epi layer 204 located on top of a P+ layer 364 and a buried oxide layer 362 positioned between the P+ layer 364 and the N+ substrate 202. The SOI substrate in this device has more effective "pinching" of the N-drift region to reduce hot carrier effects and maximize the drain-source breakdown voltage $BV_{ds}$.

The LDMOS devices having a LDMOS structure formed in a Silicon on Insulator (SOI) substrate as described in FIGS. 3A-3E have lower capacitance (since the body 206 is no longer in direct contact with N+ substrate), thinner trenches for the Trench-Drain (because no need for thick P-region to reduce capacitance) and higher breakdown voltage.

FIGS. 4A-4M are cross-sectional views illustrating the steps of a first method for making a LDMOS device of the type depicted in FIG. 2A.

Figure 4A:
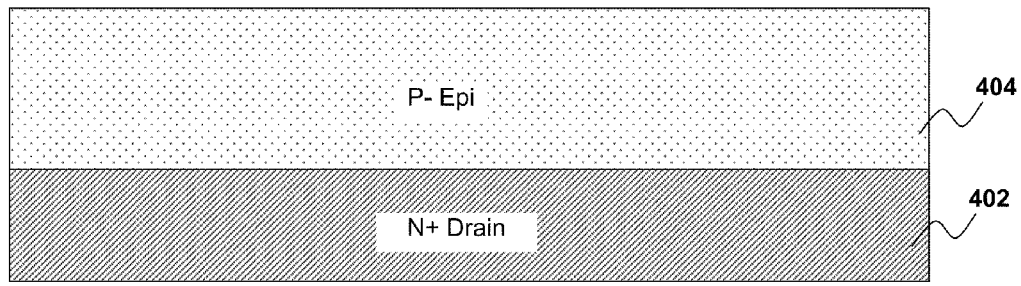
FIGS. 4A-4M are cross-sectional views illustrating the steps of a method of making a lateral DMOS device of the type depicted in FIG. 2A.

As shown in FIG. 4A, a starting material may include a N+ substrate 402 and a P-Epi layer 404 formed on top of the N+ substrate 402. The N+ substrate 402 may include dopants, such as Arsenic in sufficient quantity to provide a resistivity of 3 to 5 mOhm-cm or lower if available and may have <100> orientation with a standard prime. The P-Epi layer 404 may have a thickness of about 2 um to 10 um and a low doping concentration of about $5 \times 10^{14}/cm^3$ to $5 \times 10^{15}/cm^3$, preferably about $1 \times 10^{15}/cm^3$ for 20-60V applications.

Figure 4B:
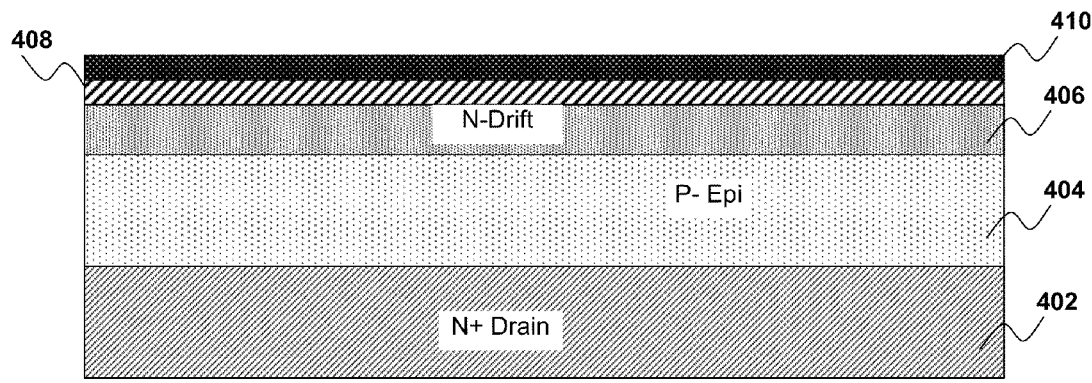

A pad oxide 408 with a thickness in the range of about 150 angstroms (Å) and 450 Å is deposited on top of the P-Epi layer 404 as shown in FIG. 4B. Optional alignment layers may be formed on the wafer surface by patterning an optional zero mask followed by a shallow silicon etch (typically around 1000 Å-2000 Å). N-type dopant, e.g., phosphorus with a dosage of about $2 \times 10^{12}/cm^3$ to $5 \times 10^{13}/cm^3$, is implanted on the top surface of the P-Epi layer 404 to form N-drift layer 406. An optional nitride layer 410 may then be deposited on the wafer surface and patterned using an optional active area mask to form an optional field oxide using Local Oxidation of Silicon (LOCOS). The thickness of the nitride layer is preferably between 750 Å and 2000 Å. Following the deposition of an active area mask on top of the nitride layer 410 (not shown), which is optional, the etching of the nitride layer 410 from non-active region is performed and the resist is then stripped. Field oxidation can be performed at this point by removing part of nitride and exposing to oxygen and heat, which is shown later in FIGS. 8A-8M.

Figure 4C:
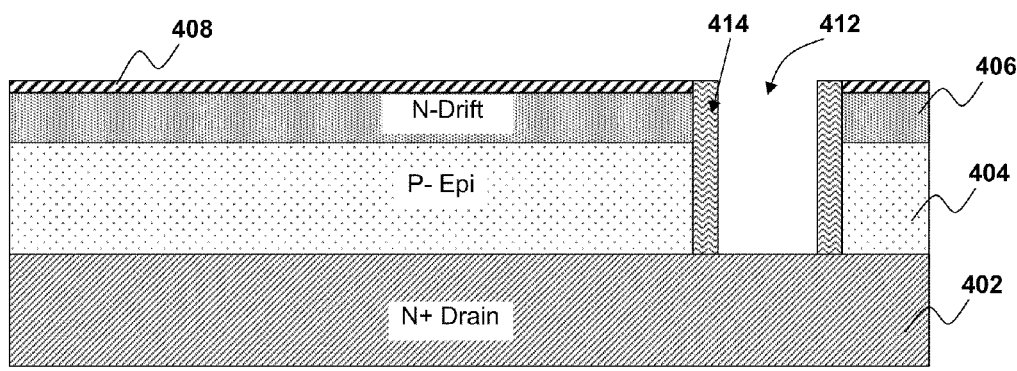

The nitride layer 410 is then stripped as shown in FIG. 4C. A drain trench mask is applied on top of the structure (not shown). A drain trench 412 is formed by etching the pad oxide 408, the N-drift layer 406 and the P-Epi layer 404 down to the N+ substrate 402. The drain trench mask is then stripped. A unique silicon round hole etch, e.g., an isotropic silicon etch, may be carried out to round off the trench bottom corners. Conformal oxide deposition is performed in the trench 412 following by a vertical etching of oxide at the bottom of the trench 412, e.g., using reactive-ion-etching (RIE), to form oxide spacers 414 on the side wall of the trench 412. N+ dopant is optionally implanted at the bottom of the drain trench 412.

Figure 4D:
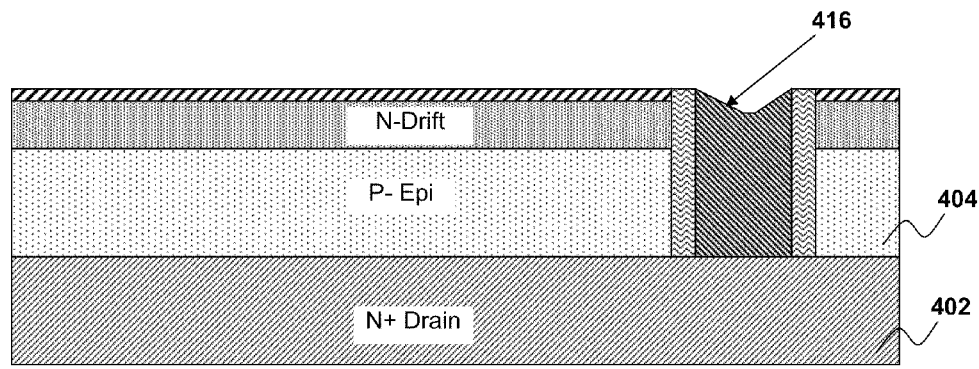

As shown in FIG. 4D, N+ polysilicon is deposited in the drain trench 412 to form a drain contact 416. The polysilicon in the drain trench may be doped with any suitable N+ dopants, such as Arsenic or Phosphorus. If the polysilicon forming the drain contact 416 is not in-situ doped, the polysilicon can be doped using high dose ion implantation, or pre-deposition using POCL3 diffusion, for example. The N+ polysilicon in the drain contact 416 may then be etched back until polysilicon is removed from the horizontal wafer surfaces, i.e., the end point of the etching back is on the top surface of the pad oxide 408 with perhaps a slight over etch.

Figure 4E:
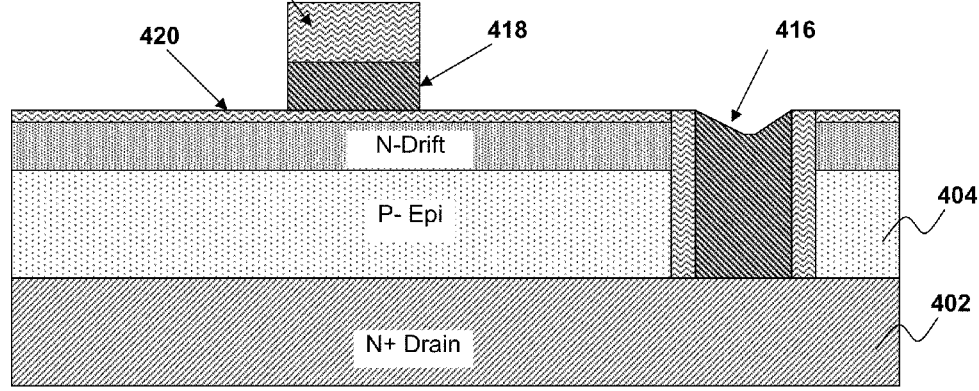

The thin pad oxide 408 may then be stripped as shown in FIG. 4E. A sacrificial oxide is formed on top of the N-drift layer 406 and then is stripped followed by the formation of gate oxide layer 420. Polysilicon may then be deposited on top of the gate oxide layer 420 to form a gate 418. The thickness of the gate 418 may be between about 1000 Å and 6000 Å. N+ dopant may be either in-situ doped or implanted into the polysilicon gate 418. An optional oxide cap layer 422 may then be deposited on top of the N+ polysilicon gate 418. The oxide layer 422 preferably includes a low temperature oxide (LTO), such as plasma-enhanced tetraethylorthosilicate (PETEOS) with a thickness of about 1000 Å to 5000 Å. A gate mask is applied on top of the oxide layer 422 (not shown) following with the etching of the oxide layer 422 and N+ polysilicon gate 418.

Figure 4F:
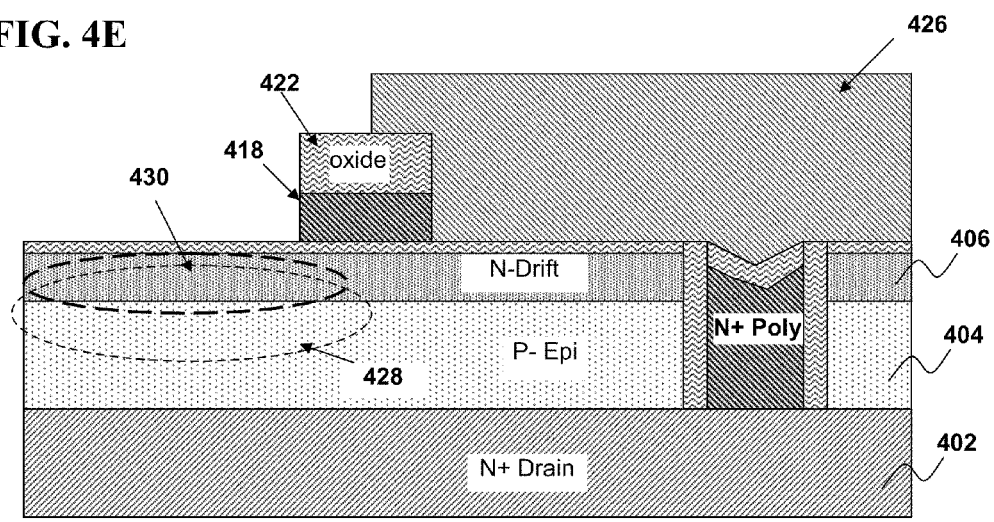

As shown in FIG. 4F, a body photoresist mask 426 may be applied on top of the structure to define an edge of the body region. The photoresist mask 426 may be retained on the drain structure during subsequent formation of a deep body implant 428. The deep body implant region 428 can control JFET pinching by compensating the drift towards the drain side of the gate. By way of an example, the deep body implant can be performed using B11 at a dosage of about $1 \times 10^{13}$/cm$^3$ to $5 \times 10^{14}$/cm$^3$, zero tilt, and an energy of about 100 KeV to 650 KeV or at a dosage of $1 \times 10^{13}$ to $5 \times 10^{14}$/cm$^3$, multiple titled implants with rotation and with an energy of about 100 KeV to 650 KeV. After the deep implant, shallow body implant region 430 may be formed. The shallow body implant 430 controls the channel. By way of an example, the shallow body implant can be performed using Boron at a dosage of about $3 \times 10^{13}$/cm$^3$ to $2 \times 10^{14}$/cm$^3$, zero tilt and an energy of 20 KeV to 60 KeV.

Figure 4G:
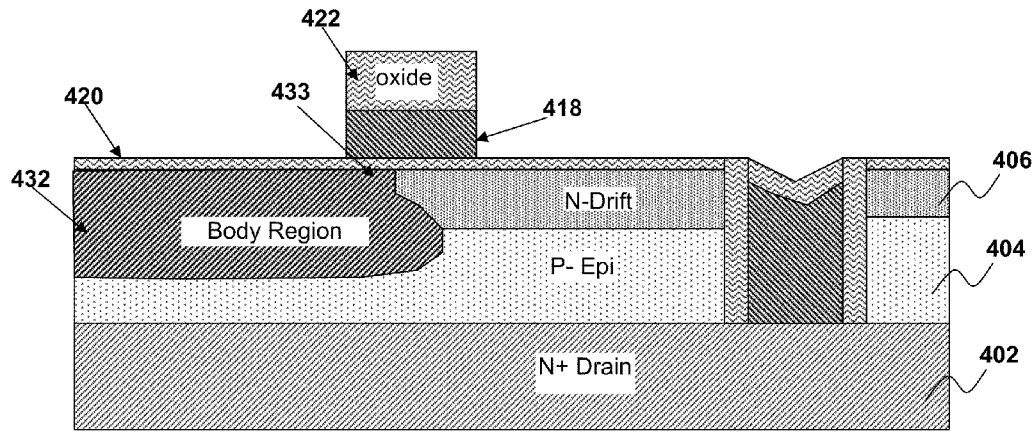

As shown in FIG. 4G, the photoresist mask 426 may then be removed, e.g., using a wet etch. A drive-in step, may then be performed to diffuse the p type implants in body region 432 with the resulting profile of the body region, which includes channel region 433 in a portion of the body region (indicated by the arrow) that underlies the gate 418. By way of example, and not by way of limitation, the drive-in may be performed by heating the substrate for 20-120 minutes at 1000-1150 degrees Centigrade, with slight O$_2$ during loading and N$_2$ during drive.

Figure 4H:
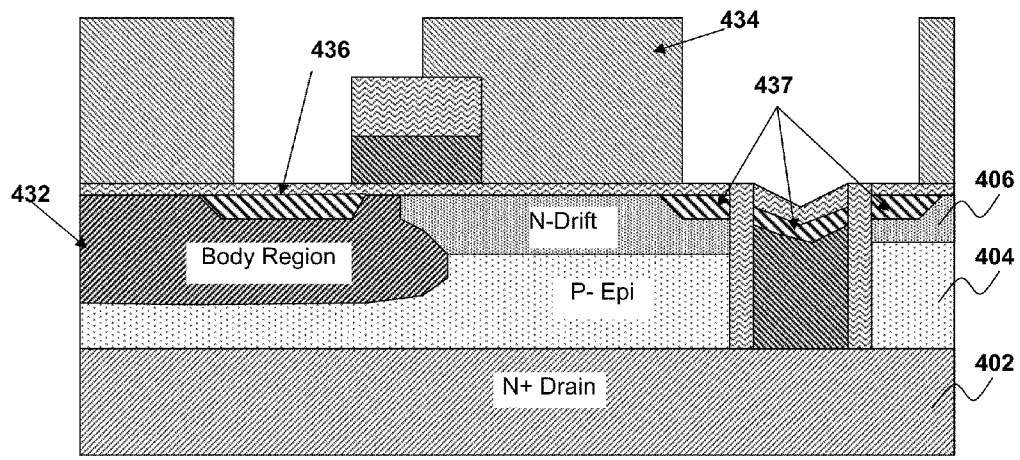

As shown in FIG. 4H, a source/drain contact photoresist mask 434 is deposited over the gate oxide layer 420 and oxide cap 422. N+ dopant may be implanted through openings in the mask 434 to form an N+ source region 436 and N+ drain contact regions 437. By way of example, Arsenic may be ion implanted at implantation energy from 50 KeV-150 KeV with a dosage of about $2 \times 10^{15}$/cm$^3$ to $1 \times 10^{16}$/cm$^3$ and zero tilt.

Figure 4I:
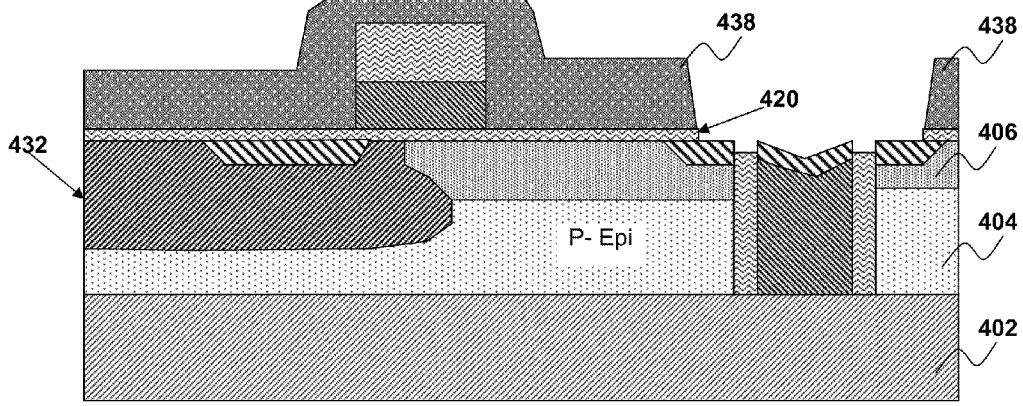

As shown in FIG. 4I, photoresist mask 434 is then removed and N+ source region 436 and N+ drain contact region 437 are annealed. An oxide layer 438 may be deposited over the surface of the oxide layers 420 and 422. The oxide layer 438 can be a low temperature oxide (LTO), or a combination of LTO and Borophosphosilicate glass (BPSG) with reflow or PETEOS. A drain contact mask (not shown) is deposited over the oxide layer 438 followed with the etching of the oxide layer 438 and pad oxide 408.

Figure 4J:
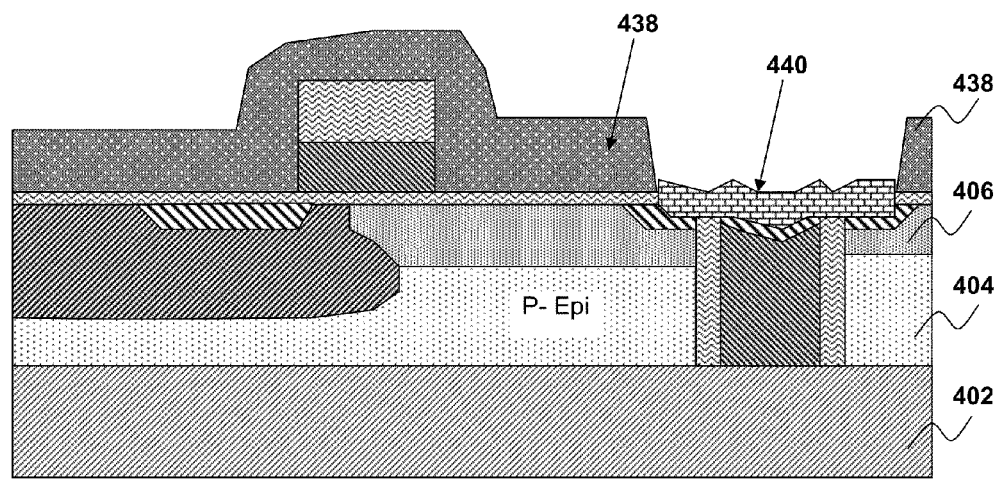

As shown in FIG. 4J, a silicide strap 440 is formed on top of the drain contact 416. By way of example, the silicide may be formed by deposition of Titanium followed by a rapid thermal annealing (RTA) process under nitrogen atmosphere, at 650° C. to 700° C. in 30-60 seconds. The thickness of the Titanium layer may be about 300 Å to 1000 Å. The resulting Titanium Nitride (TiN) layer may then be etched, for example using a salicide wet etch. Titanium Silicide (TiSi$_x$) may then be formed with a RTA process under nitrogen atmosphere, at 800 C. to 900 C.

Figure 4K:
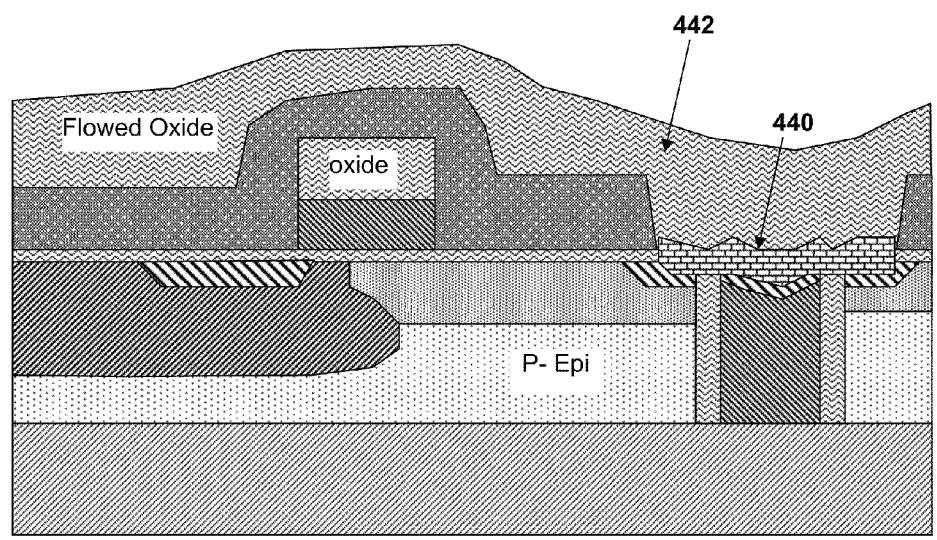

As shown in FIG. 4K, a LTO deposition and BPSG deposition may be performed over the oxide layer 438 and silicide strap 440 following with the flow and densification at a temperature of about 800° C.-900° C. to prevent the damage of the silicide strap 440 and to form an oxide layer 442.

Figure 4L:
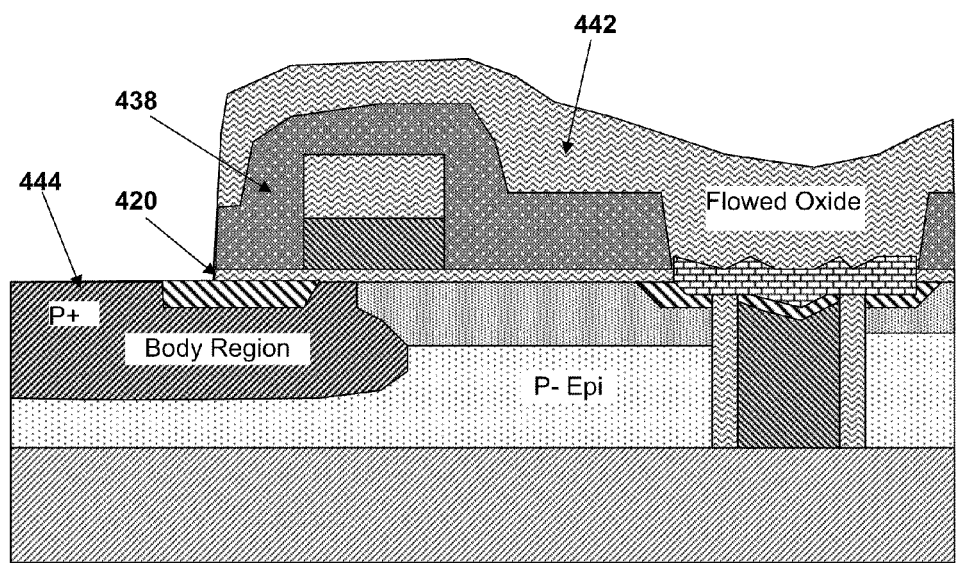

A source/body contact mask (not shown) including gate electrode contact opening (not shown) is deposited over the oxide layer 442. Oxide layers 442 and 438 are etched with the end point at the top surface 444 of the P-Epi layer 404 as shown in FIG. 4L. Optionally, wet etch is used to form a wine-cup shaped contact opening. The P-Epi layer 404 may optionally be etched to form trench contact. P+ dopant, such as Boron, may then be implanted to form a body contact. By way of example, Boron DiFluoride (BF$_2$) may be implanted at a dosage of $5 \times 10^{14}$/cm$^3$ to $2 \times 10^{15}$/cm$^3$ at an energy of 40 KeV to 80 KeV and zero tilt or Boron (e.g., $^{11}$B) at a dosage of $5 \times 10^{14}$/cm$^3$ to $2 \times 10^{15}$/cm$^3$ at an energy of 40 KeV to 80 KeV and zero tilt to improve body contact. The Boron contact may then be annealed by rapid thermal processing (RTP) with optional reflow to smooth the top corners.

Figure 4M:
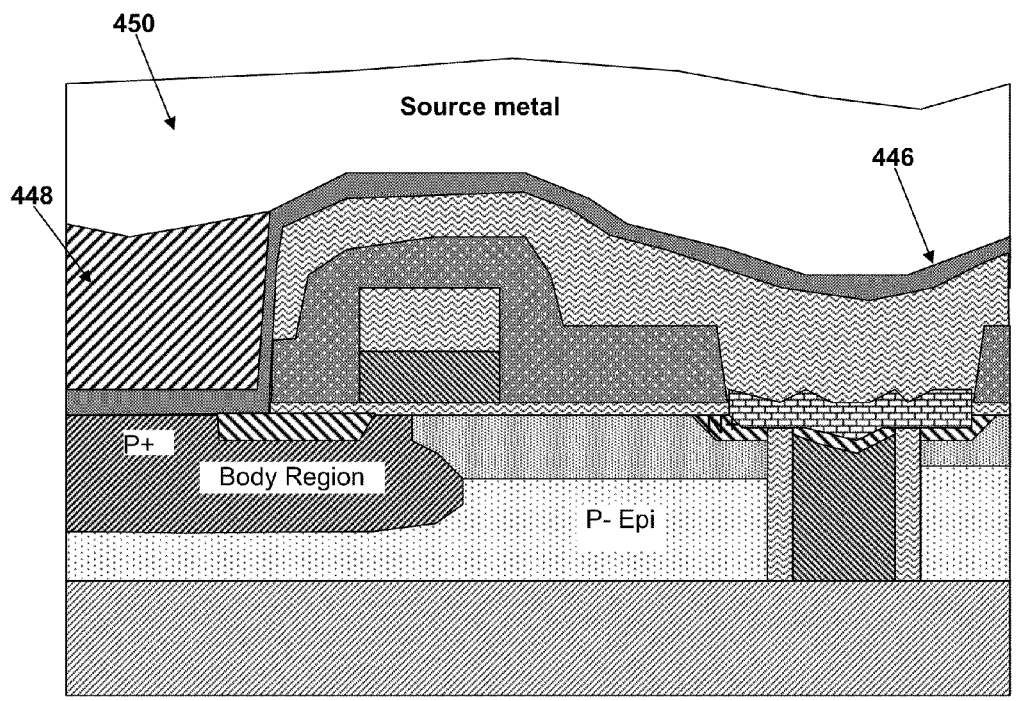

A barrier metal layer 446 may be deposited over the oxide layer 442 as shown in FIG. 4M. By way of example, the barrier metal may be Titanium or Titanium Nitride or some combination of the Titanium and Titanium Nitride. A metal plug (e.g., a Tungsten plug) 448 may optionally be deposited and then etched back. A thick source metal layer 450 is deposited over the plug 448 and barrier metal layer 446. The source metal layer 450 may include Aluminum (Al) with a thickness of about 1 μm to 5 μm. The top of the device may be completed with an optional passivation (not shown).

Figure 5A:
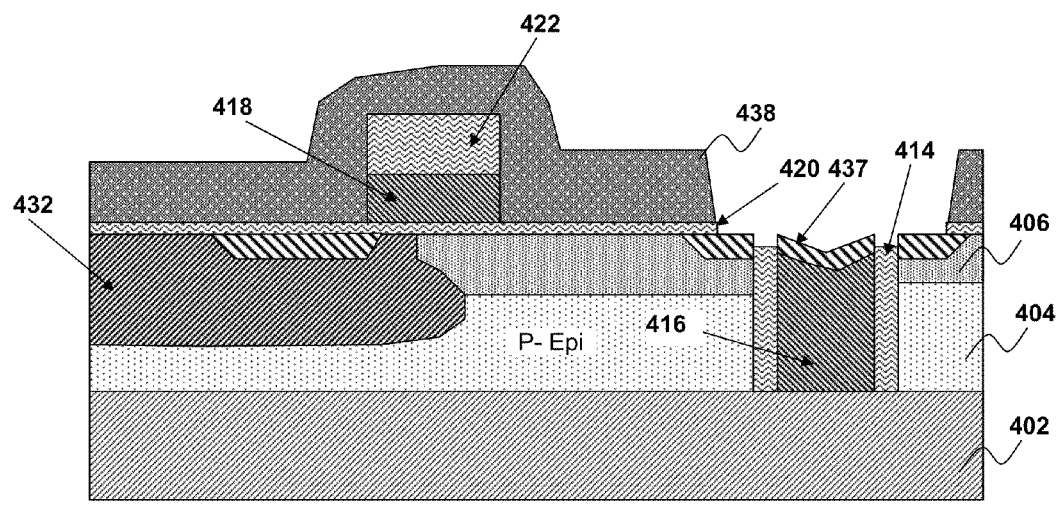
FIGS. 5A-5B are cross-sectional views illustrating the different steps from method described in FIGS. 4A-4M of making a lateral DMOS device of the type depicted in FIG. 2B.
Figure 5B:
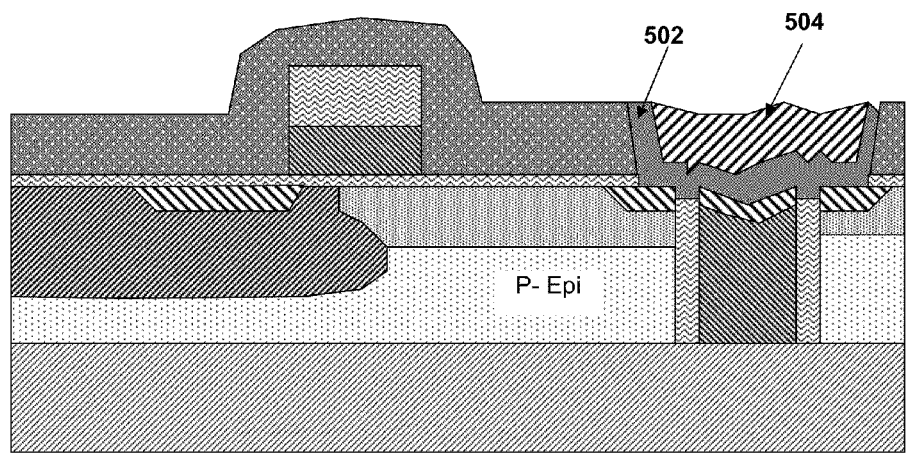

FIGS. 5A-5B are cross-sectional views illustrating the steps of a second method of making a LDMOS device of the type depicted in FIG. 2B.

The alternative method starts similarly to the first method from FIG. 4A to FIG. 4I. FIG. 5A of the second method is the same as FIG. 4I of the first method. Referring to FIG. 5B, a barrier metal 502 is deposited on top of the drain contacts regions 437. The barrier metal is formed by Ti/TiN deposition and rapid thermal annealing (RTA) process under nitrogen atmosphere, at 800° C. to 900° C. in 30-60 seconds. A metal plug 504 (e.g., made of Tungsten) is then deposited over the barrier metal 502 following with the etching back of metal plug 504 and barrier metal. The device may be completed with processing steps similar to those depicted in FIGS. 4K-4M of the first method and described above.

Figure 6A:
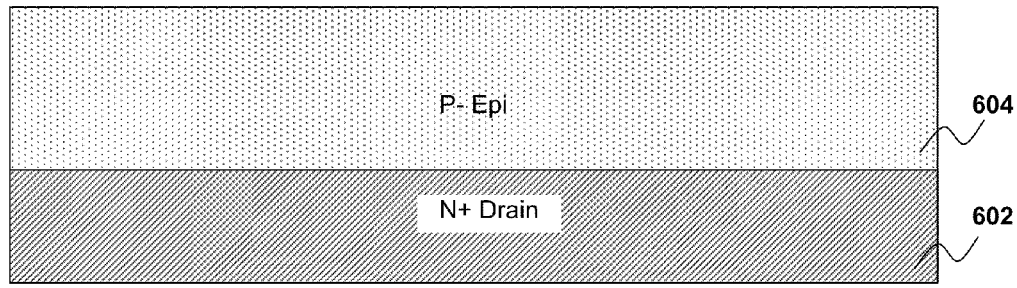
FIGS. 6A-6K are cross-sectional views illustrating the steps of a method of making a lateral DMOS device of the type depicted in FIG. 2C.
Figure 6B:
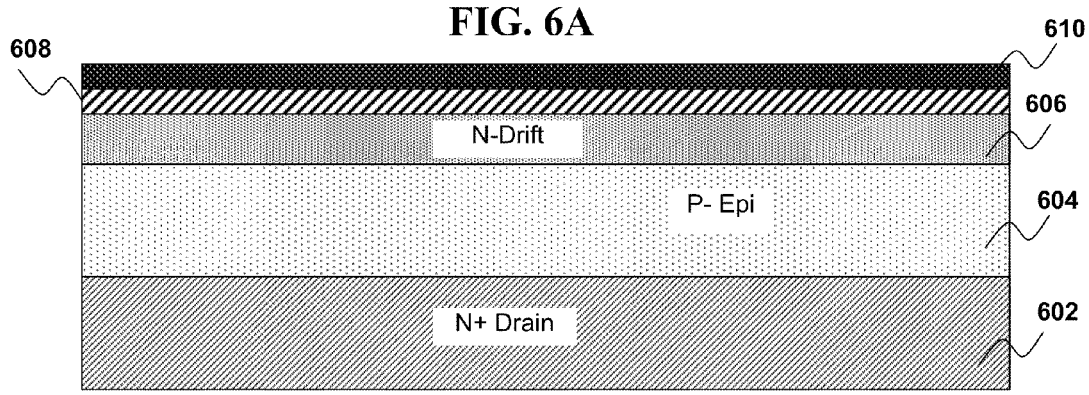
Figure 6C:
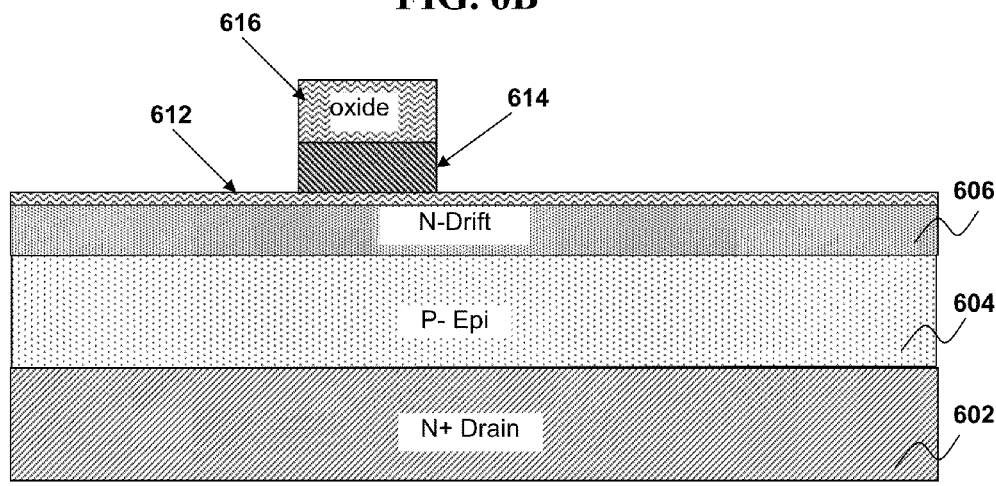

FIGS. 6A-6C are cross-sectional views illustrating the steps of a third method for making a LDMOS device of the type depicted in FIG. 2C.

As shown in FIG. 6A, a starting material for the device may be a N+ substrate 602 with a P-Epi layer 604 formed on top of the N+ substrate 602. The N+ substrate 602 may include Arsenic having 3 to 5 mOhm-cm resistivity or lower if available and may have <100> crystal orientation with a standard prime. The P-Epi layer 604 may have a thickness of about 2 μm to 10 μm and a low doping concentration of about $5 \times 10^{14}$/cm$^3$ to $5 \times 10^{15}$/cm$^3$, preferably about $1 \times 10^{15}$/cm$^3$ for 20-60V applications.

A pad oxide 608 with a thickness in the range of about 150 Å to about 450 Å is deposited on top of the P-Epi layer 604 as shown in FIG. 6B. Optional alignment layers can be formed on the wafer surface by patterning an optional zero mask followed by a shallow silicon etch (typically around 1000 Å-2000 Å). N-type dopants, preferably phosphorus with a dosage of about $2 \times 10^{12}$/cm$^3$ to $5 \times 10^{13}$/cm$^3$, may be implanted on the top surface of the P-Epi layer 604 to form an N-drift layer 606. An optional nitride layer 610 can now be deposited on the wafer surface and patterned following an optional active area mask to form an optional field oxide using LOCOS. The thickness of the nitride layer is preferably between 750 Å and 2KÅ. Following the deposition of an active area mask on top of the nitride layer 610 (not shown), which is optional, the nitride layer 610 may be removed from the non-active region and the resist may then be stripped. Field oxidation may be performed at this point by removing part of nitride and exposing to oxygen and heat, which is shown later in FIGS. 8A-8M.

The nitride layer 610 and the thin pad oxide 608 are then stripped as shown in FIG. 6C. A sacrificial oxide is formed on top of the N-drift layer 606 and then is stripped followed by a gate oxidation to form gate oxide layer 612. Conductive material, e.g., Polysilicon may be deposited on top of the gate oxide layer 612 to form a gate 614. The thickness of the gate 614 may be about 1KÅ to 6KÅ. N+ dopants may be either in-situ doped or implanted into the polysilicon gate 614 to provide a desired degree of electrical conductivity. An oxide layer 616 may be deposited on top of the gate 614. The oxide layer 616 may include a low temperature oxide (LTO) or plasma-enhanced tetraethylorthosilicate (PETEOS) with a thickness of about 1KÅ to 5KÅ. A gate mask may be applied on top of the oxide layer 616 followed by etching of the oxide layer 616 and gate 614.

Figure 6D:
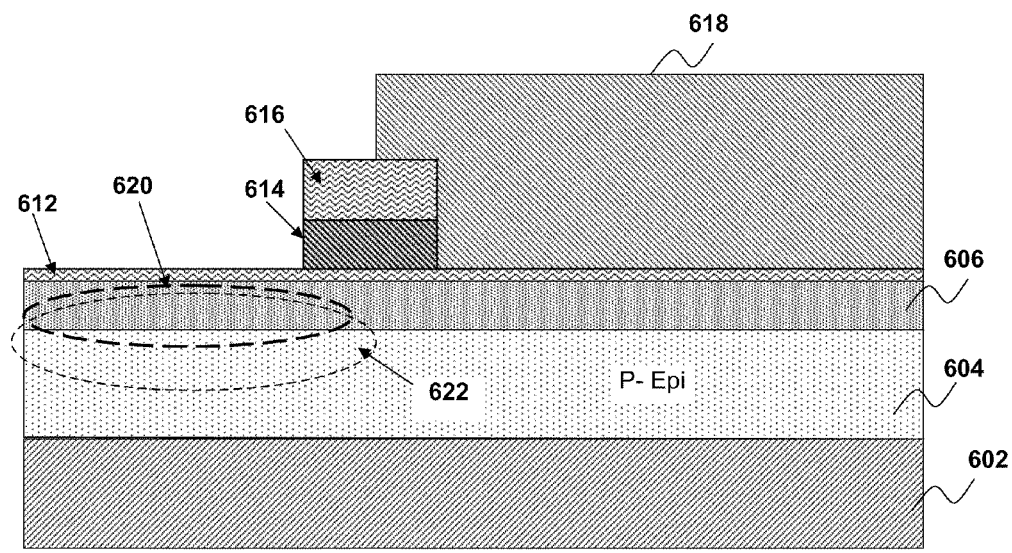

As shown in FIG. 6D, a body photoresist mask 618 is applied on top of the structure to define the edge of the body region and is retained on the drain structure during subsequent formation of the deep body implant 622. The deep body implant 622 controls JFET pinching by compensating the drift towards the drain side of the gate. By way of an example, the deep body implant can be performed using Boron (e.g., $^{11}$B) at a dosage of about $1 \times 10^{13}$/cm$^3$ to $5 \times 10^{14}$/cm$^3$, zero tilt, and an energy of about 100 KeV to 650 KeV. After deep implant, a shallow body implant 620, which controls the channel, may be formed. By way of an example, the shallow body implant can be performed using Boron (e.g., $^{11}$B) at a dosage of about $3 \times 10^{13}$/cm$^3$ to $2 \times 10^{14}$/cm$^3$, zero tilt and at an energy of 20 KeV to 60 KeV.

Figure 6E:
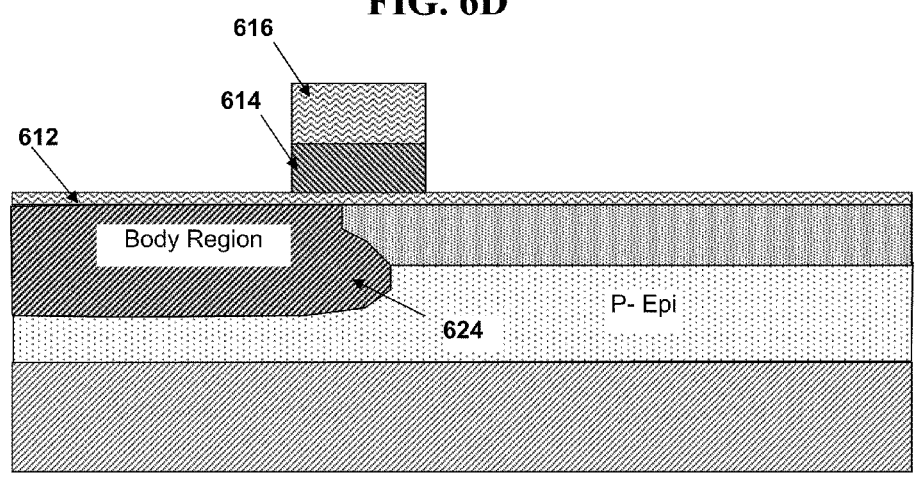

As shown in FIG. 6E, the photoresist mask 618 is then removed, using a wet etch for example. A drive-in step, for example 20-120 minutes at 1000-1150 degrees Centigrade, slight $O_2$ during load and $N_2$ during drive, is performed to diffuse the p type implants in body region 624 with the resulting profile shown in FIG. 6E.

Figure 6F:
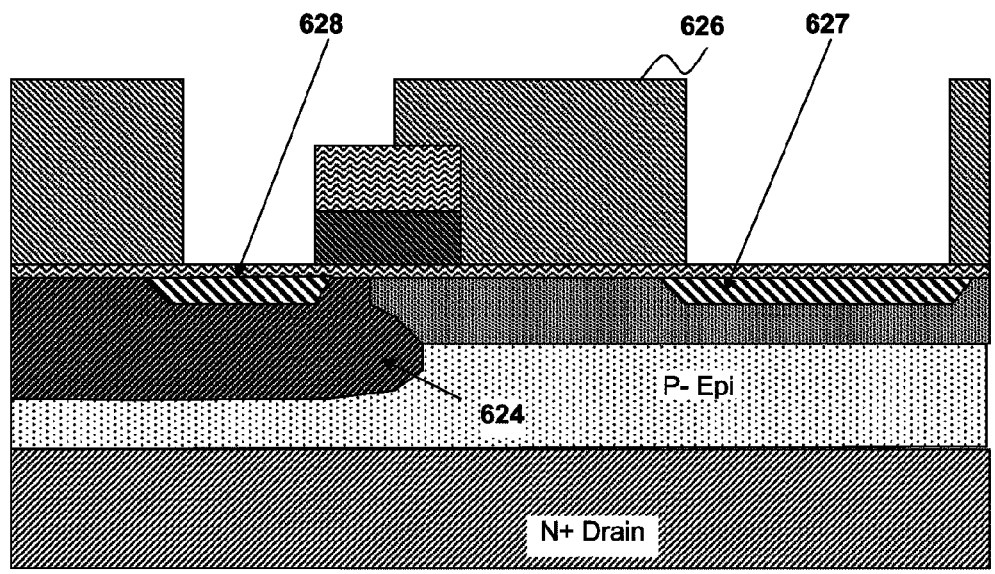

As shown in FIG. 6F, a source/drain contact photoresist mask 626 is deposited over the gate oxide layer 612 and oxide cap 616. N+ dopant is implanted to form N+ source region 628 and N+ drain contact region 627. By way of an example, Arsenic can be implanted at 50 KeV-150 KeV with a dosage of about $2 \times 10^{15}$/cm$^3$ to $1 \times 10^{16}$/cm$^3$ and zero tilt.

Figure 6G:
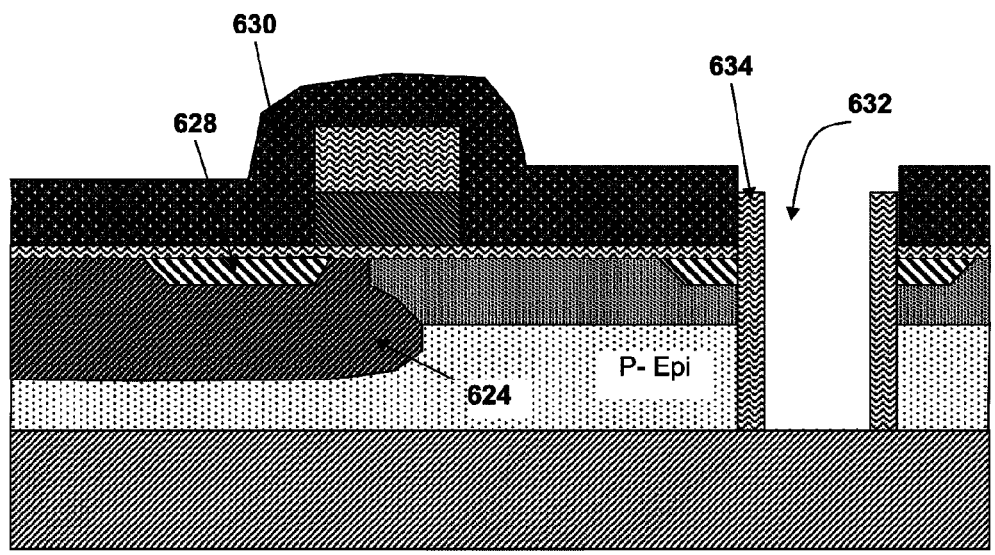

As shown in FIG. 6G, photoresist mask 626 is then removed. An oxide layer 630 is deposited over the surface of the oxide layers 612 and 616. A drain trench mask is applied on top of the structure (not shown). A drain trench 632 is formed by etching the oxide layers 630 and 612, the N-drift layer 606 and the P-Epi layer 604. The drain trench mask is then stripped. A unique silicon round hole etch, e.g., an isotropic silicon etch, may be carried out to round off the trench bottom corners. Conformal oxide deposition is performed in the trench 632 following with a vertical etching of oxide to form oxide spacer 634 on the side wall of the trench 632 using reactive-ion-etching (RIE) for example. N+ dopant is optionally implanted at the bottom of the drain trench 632.

Figure 6H:
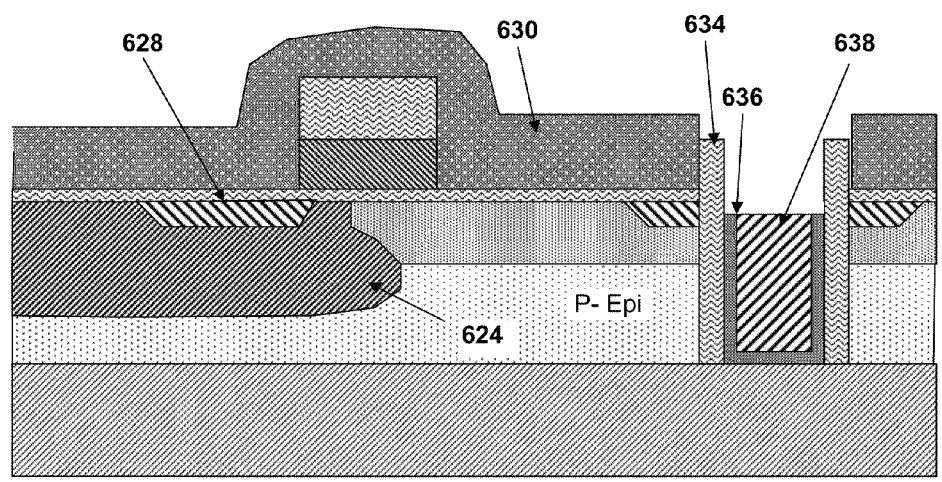

As shown in FIG. 6H, a barrier metal layer 636 is deposited on the sidewall and the bottom of the trench 632. The barrier metal is preferably Ti/TiN. The barrier metal layer 636 is optionally annealed at room temperature. A metal, e.g., Tungsten (W), plug 638 is then deposited into the trench 632. The barrier metal layer 636 and the plug 638 are etched back with an endpoint recessed to just below the top surface of the N-drift layer 606.

Figure 6I:
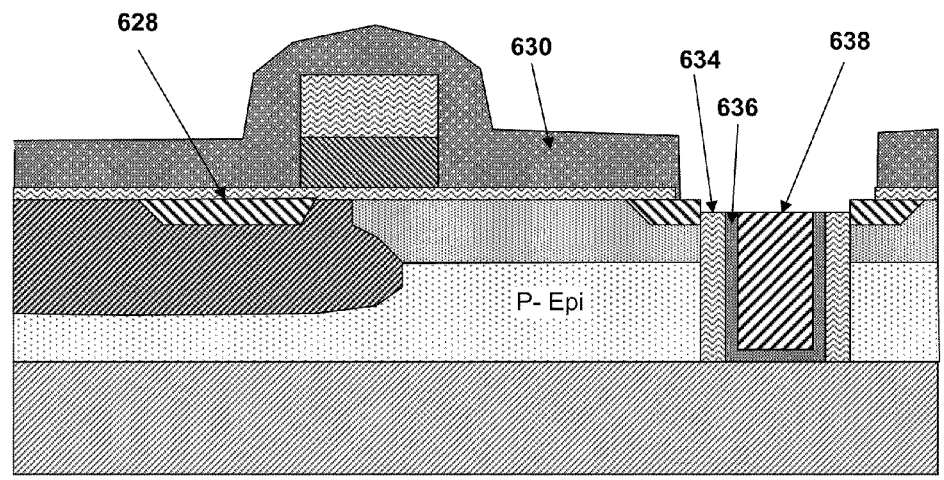

The oxide layers 630, 612 and oxide spacer 634 are etched back to a thickness equivalent to the width of the oxide spacer 634 as shown in FIG. 6I. This step can be performed using a wet etch that does not etch the metal that forms the plug 638 or a dry etch. By way of example etching oxide with $CF_4$+ $CHF_3$, does not etch tungsten.

Figure 6J:
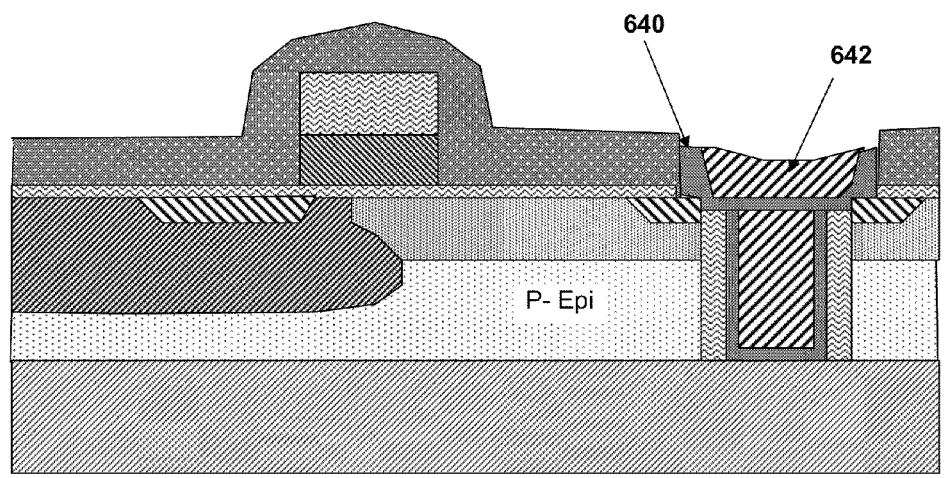

A second barrier metal layer 640 is deposited on top of the plug 638 as shown in FIG. 6J. A second tungsten plug 642 is then deposited on top of the second barrier metal 640. The second barrier metal layer 640 and the second tungsten plug 642 are etched back to a predetermined thickness.

Figure 6K:
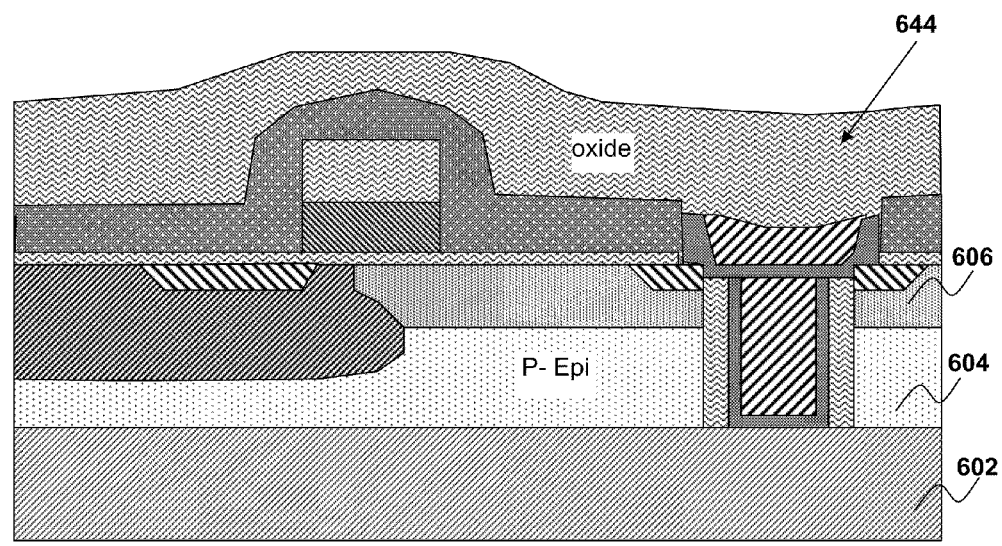

As shown in FIG. 6K, a LTO deposition and BPSG deposition may be performed over the oxide layer 630, second barrier metal layer 640 and second tungsten plug 642 following with the flow and densification to form oxide layer 644. The device is completed with the steps as shown in FIGS. 4L-4M of the first method and described above.

Figure 7A:
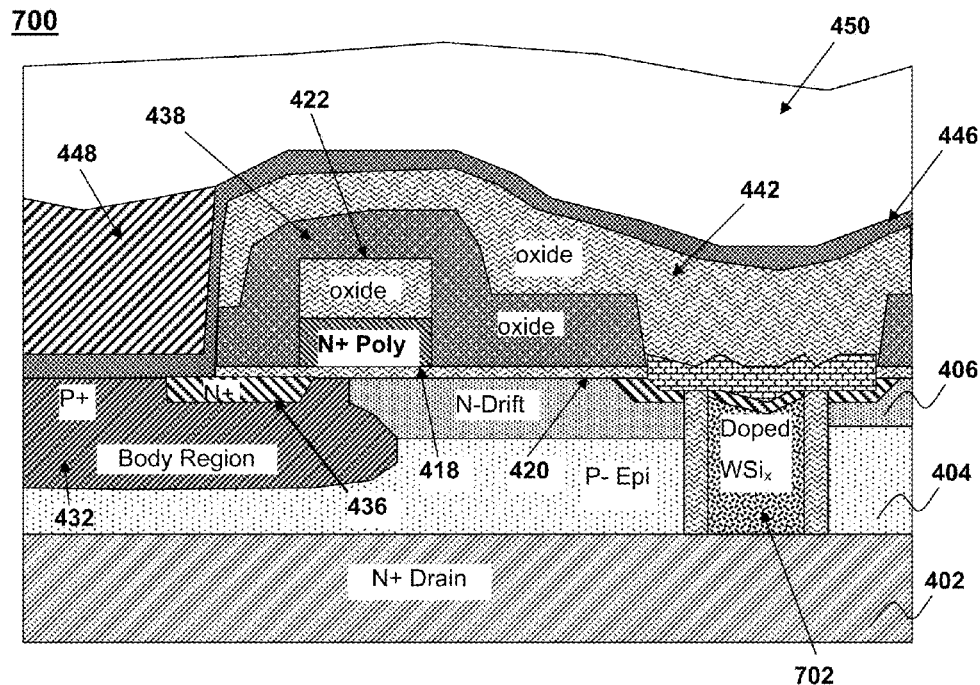
FIGS. 7A-7C are cross-sectional views illustrating alternative steps of the method described in FIGS. 4A-4M.

FIG. 7A is a cross-sectional view illustrating a complete LDMOS device 700 that can be made using the first method described above, except that at the step shown in FIG. 4D, the drain trench 412 may be filled with doped Tungsten Silicide ($WSi_x$) to form a drain contact 702. This step can be performed by co-depositing W and Si, for example, sputtering W and Si or CVD with $WF_6$ and $SiH_4$.

Figure 7B:
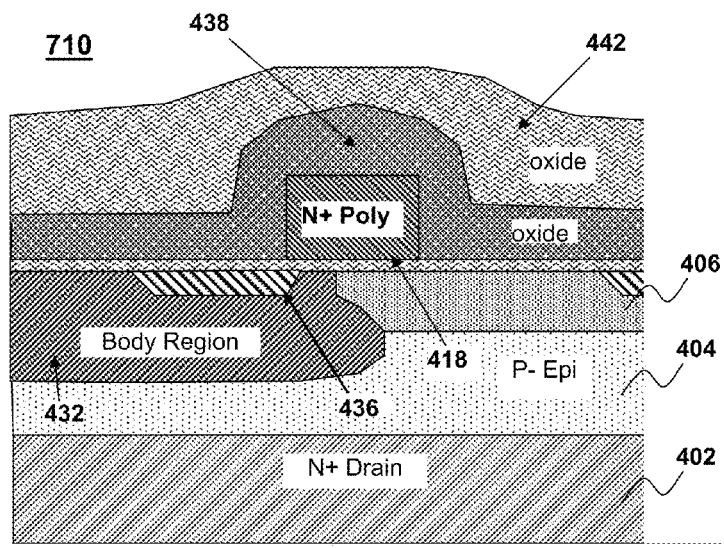

FIG. 7B is a cross-sectional view illustrating an alternative LDMOS device 710 that can be made using any of the methods described above, except that the step of depositing an oxide cap on top of the gate may be skipped. For example, the deposition of oxide cap in the step shown in FIG. 4E of the first method may be skipped.

Figure 7C:
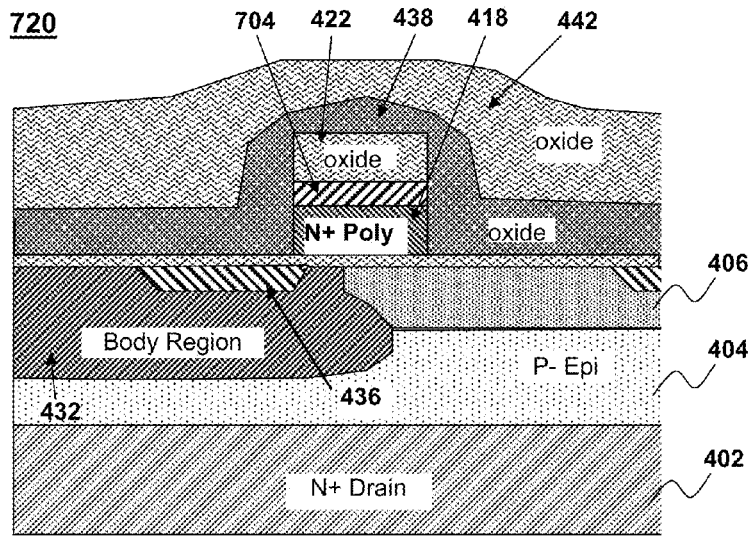

FIG. 7C is a cross-sectional view illustrating an alternative LDMOS device 720 that can be made using any of the methods described above, except that a $WSi_x$ layer 724 is deposited between the polysilicon gate 418 and the oxide cap 422. For example, in the step shown in FIG. 4E of the first method, a $WSi_x$ layer may be deposited before deposition of the oxide cap 422. The layer $WSi_x$ 704 reduces the resistance of the LDMOS device, which is good for high frequency response and low gate delay.

In another embodiment, the body implant step described above with respect to FIG. 4F of the first method may be split into two separate implants. A first implant may be performed in the early process and use a deep body mask to implant a deep portion of the P-body region. This implant may be aligned to the photoresist edge and not the gate stack edge. As a result, the implant may extend more laterally towards the drain contact to pinch-off the accumulation length and reduce hot carrier injection. A second implant, the shallow body implant, may be performed during the standard body mask step, i.e. at the step described above with respect to FIG. 4F of the first method, which only implants the shallow channel region by diffusing under the gate.

FIGS. 8A-8M are cross-sectional views illustrating the steps of a fourth method for making a LDMOS device of the type depicted in FIG. 2D.

Figure 8A:
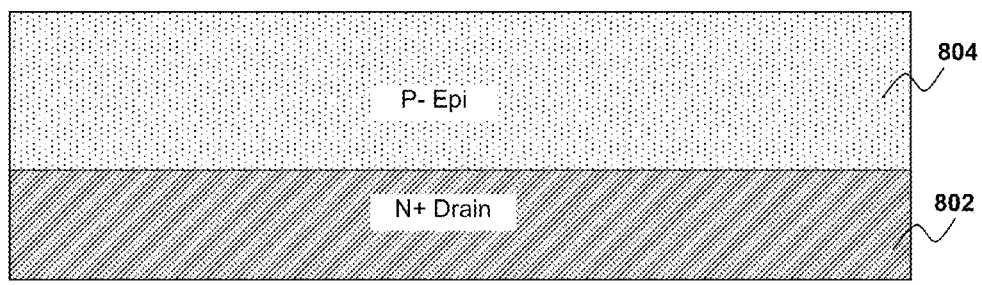
FIGS. 8A-8M are cross-sectional views illustrating the steps of a method of making a lateral DMOS device of the type depicted in FIG. 2D.

As shown in FIG. 8A, a start material consists of a N+ substrate 802 and a P-Epi layer 804 formed on top of the N+ substrate 802. The N+ substrate 802 may include Arsenic having 3 to 5 mOhm-cm resistivity or lower if available and may have <100> orientation with a standard prime. The P-Epi layer 804 may have a thickness of about 2 μm to 10 μm and a low doping of about $5 \times 10^{14}/cm^3$ to $5 \times 10^{15}/cm^3$, preferably about $1 \times 10^{15}/cm^3$ for 20-60V application.

Figure 8B:
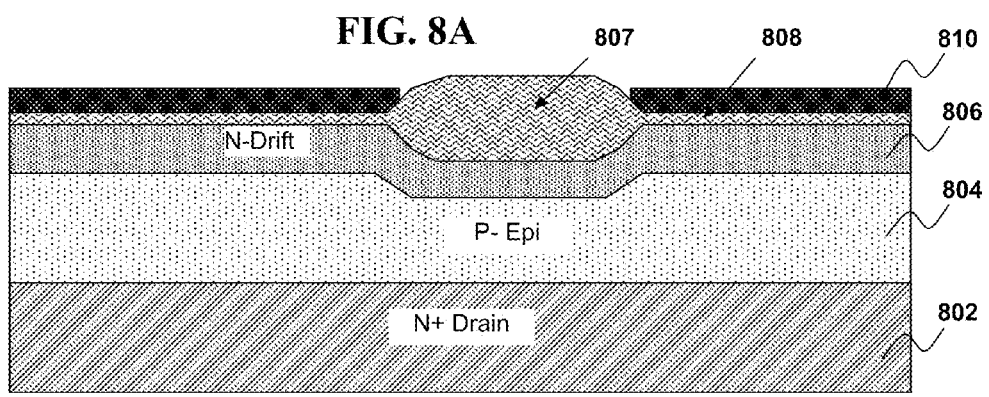

A pad oxide 808 with a thickness in the range of about 150 Å to about 450 Å is deposited on top of the P-Epi layer 804 as shown in FIG. 8B. Optional alignment layers can be formed on the wafer surface by patterning an optional zero mask followed by a shallow silicon etch (typically around 1000-2000 Å). N-type dopant, preferably phosphorus with a dosage of about $2 \times 10^{12}/cm^3$ to $5 \times 10^{13}/cm^3$, is implanted on the top surface of the P-Epi layer 804 to form N-drift layer 806. An optional nitride layer 810 may then be deposited on the wafer surface and patterned using an optional active area mask to form an optional field oxide using LOCOS. The thickness of the nitride layer is preferably between 750 Å and 2KÅ. An active area mask (not shown), which is patterned to define an active region and a field region, may be deposited on top of the nitride layer 810. The nitride layer 810 is etched from the non-active region and the field oxide regions and the resist is then stripped. A thick field oxide 807 is then grown in field region. The field oxide 807 increases oxide thickness on drain side of gate to reduce peak electric field at the gate, protect drain extension (LDD or N-drift) region during the source implant and eliminates the source mask in the following step by using the field oxide to block the source implant from the drift region.

Figure 8C:
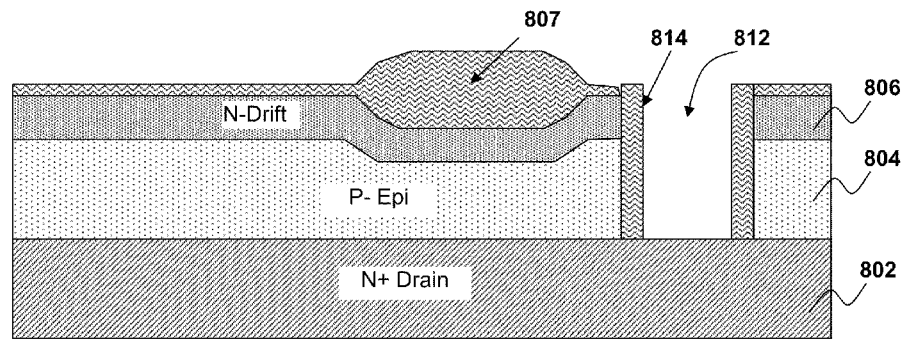

The nitride layer 810 is then stripped as shown in FIG. 8C. A drain trench mask (not shown) is applied on top of the structure. A drain trench 812 is formed by etching through a selected portion of the pad oxide 808, the N-drift layer 806 and the P-Epi layer 804. The drain trench mask is then stripped. A silicon round hole etch, e.g., an isotropic silicon etch, may be carried out to round off the trench bottom corners. Conformal oxide deposition is performed in the trench 812 following with a vertical etching of oxide to form oxide spacers 814 on the side walls of the trench 812 using reactive-ion-etching (RIE) for example. N+ dopant is optionally implanted at the bottom of the drain trench 812.

Figure 8D:
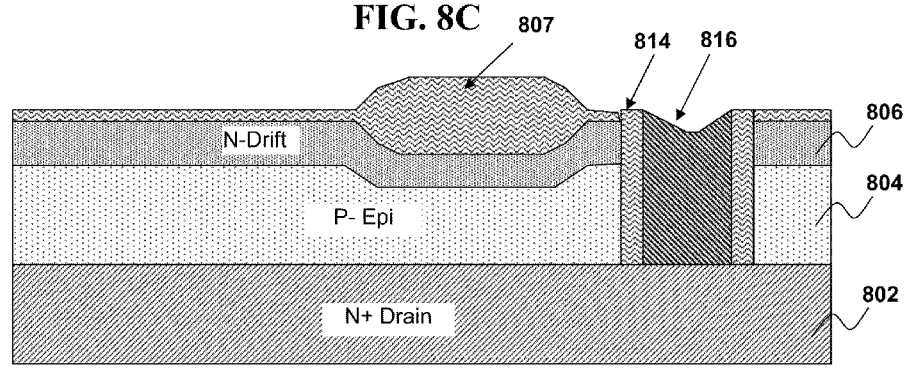

As shown in FIG. 8D, a conductive material, such as N+ polysilicon, is deposited in the drain trench 812 to form a drain contact 816. If the deposition is not done in-situ, the polysilicon can be doped using high dose ion implantation, or pre-deposition using POCL3 diffusion, for example. The conductive material forming the drain contact 816 may then be etched back until the conductive material is removed from the horizontal wafer surfaces, i.e., the end point of the etching back is on the top surface of the oxide pad 808 with slightly over etch.

Figure 8E:
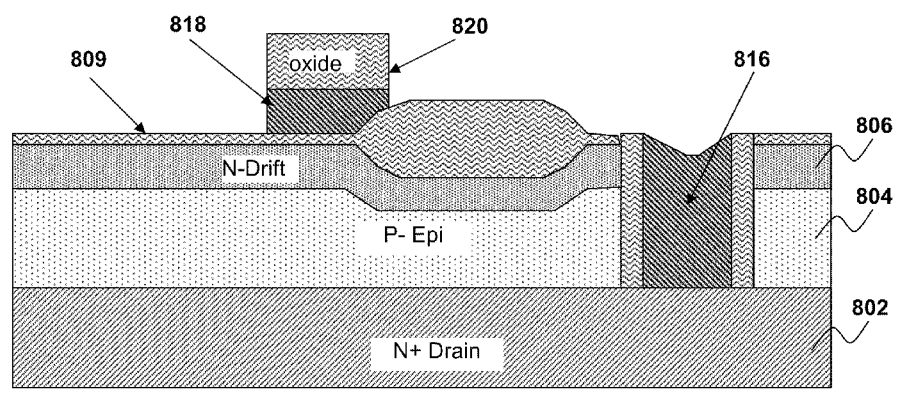

The thin pad oxide 808 is then stripped as shown in FIG. 8E. A sacrificial oxide is formed on top of the N-drift layer 806 and then is stripped followed by the growing of a gate oxide layer 809. Polysilicon is deposited on top of the gate oxide layer 809 to form a gate 818. The thickness of the gate 818 is about 1KÅ to 6KÅ. By way of example the gate may be made of N+ polysilicon. N+ dopant is either in-situ doped or implanted into the polysilicon gate 818. An oxide layer 820 is deposited on top of the gate 818. The oxide layer 820 preferably includes a low temperature oxide (LTO), such as plasma-enhanced tetraethylorthosilicate (PETEOS) with a thickness of about 1 KA to 5 KA. A gate mask is applied on top of the oxide layer 820 (not shown) following with the etching of the oxide layer 820 and N+ polysilicon gate 818.

Figure 8F:
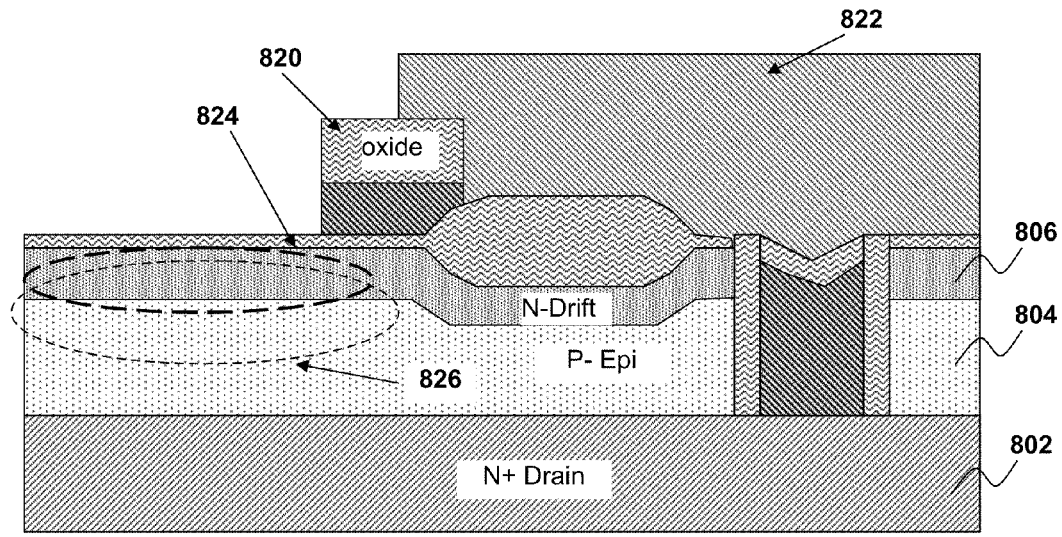

As shown in FIG. 8F, a body photoresist mask 822 is applied on top of the structure to define an edge of the body region. The mask 822 is retained on the drain structure during subsequent formation of a deep body implant 826. The deep body implant 826 controls JFET pinching by compensating the drift towards the drain side of the gate. By way of an example, the deep body implant can be performed using Boron (e.g., $^{11}B$) at a dosage of about $1 \times 10^{13}/cm^3$ to $5 \times 10^{14}/cm^3$, zero tilt, and an energy of about 100 KeV to 650 KeV or at a dosage of $1 \times 10^{13}/cm^3$ to $5 \times 10^{15}/cm^3$, multiple tilted implants with rotation and with an energy of about 100 KeV to 650 KeV. After the deep implant, shallow body implant 824, which controls channel, is formed. By way of example, the shallow body implant can be performed using $^{11}B$ at a dosage of about $3 \times 10^{13}/cm^3$ to $2 \times 10^{14}/cm^3$, zero tilt and an energy of 20 KeV to 60 KeV.

Figure 8G:
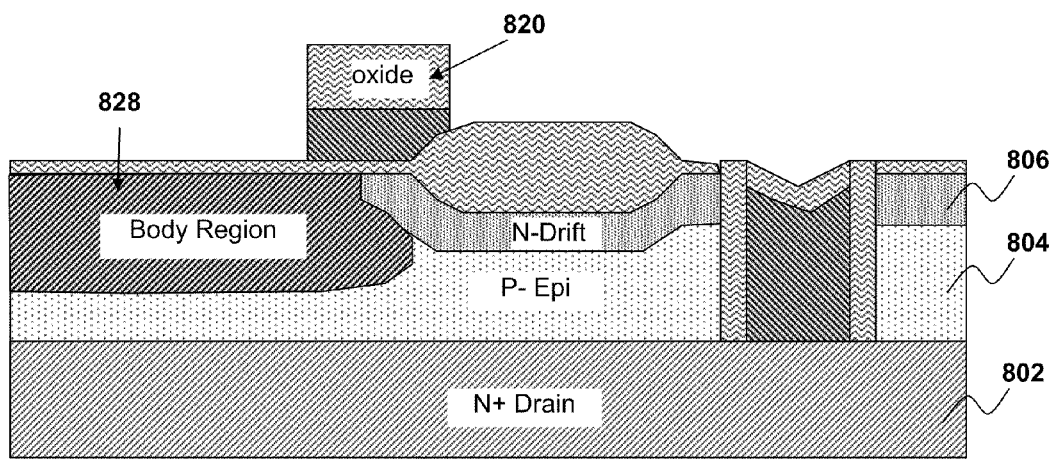

As shown in FIG. 8G, the photoresist mask 822 is then removed, using a wet etch for example. A drive-in step, for example 20-120 minutes at 1000-1150 degrees Centigrade, with slight $O_2$ during load and $N_2$ during drive, may be performed to diffuse p-type implants in body region 828.

Figure 8H:
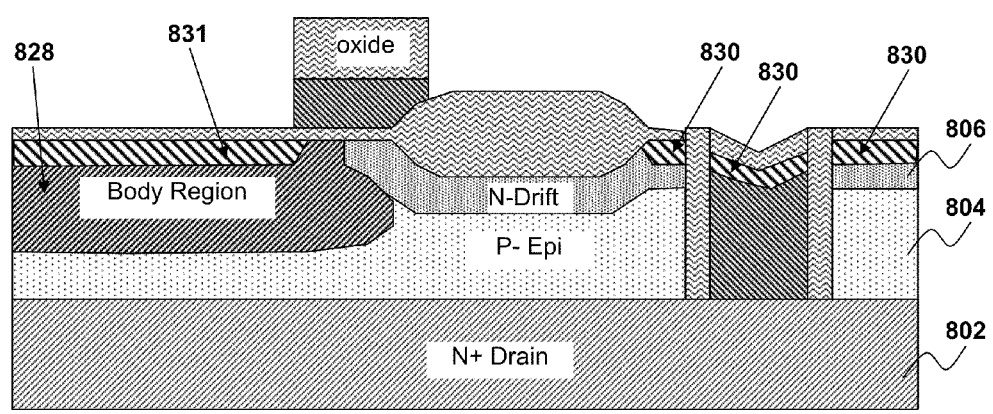

As shown in FIG. 8H, N+ dopants may be implanted into an upper portion of the body region to form an N+ source region 831 and N+ drain contact region 830. By way of an example, Arsenic can be implanted at 50 KeV-150 KeV with a dosage of about $2 \times 10^{15}/cm^3$ to $1 \times 10^{16}/cm^3$ and zero tilt.

Figure 8I:
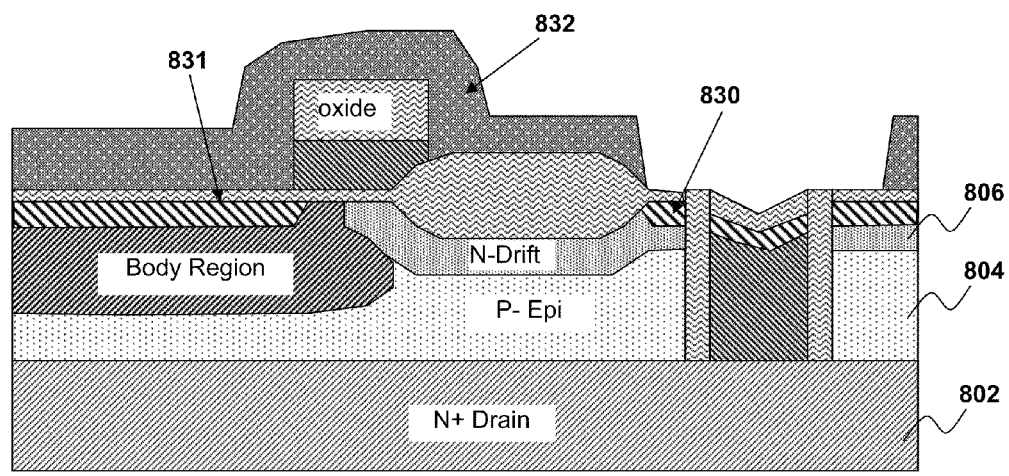

As shown in FIG. 8I, the N+ source contact region 831 and N+ drain region 830 may be annealed and an oxide layer 832 may be deposited over the surface of the oxide layers 808 and 820. The oxide layer 832 may be LTO, or LTO and Borophos-phosilicate glass (BPSG) with reflow or PETEOS. A drain contact mask (not shown) may be deposited over the oxide layer 832 following with the etching of the oxide layer 832.

Figure 8J:
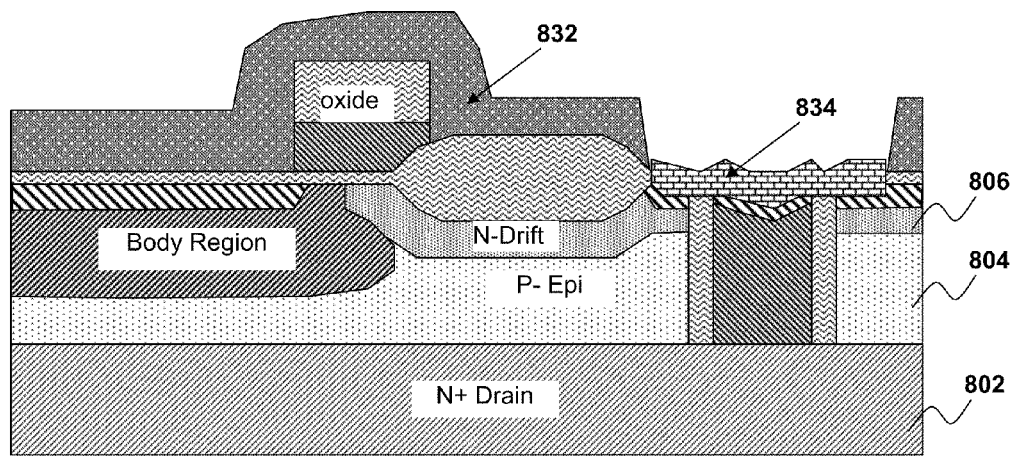

As shown in FIG. 8J, a silicide strap 834 may be formed on top of the drain contact 816. The silicide may be formed, e.g., by Titanium deposition and a rapid thermal annealing (RTA) process under nitrogen atmosphere, at 650° C. to 700° C. in 30-60 seconds. The thickness of the Titanium layer may be about 300 Å to 1000 Å. The resulting TiN layer may then be etched, for example using a salicide wet etch. $TiSi_x$ may then be formed with a RTA process under a nitrogen atmosphere, at 800° C. to 900° C.

Figure 8K:
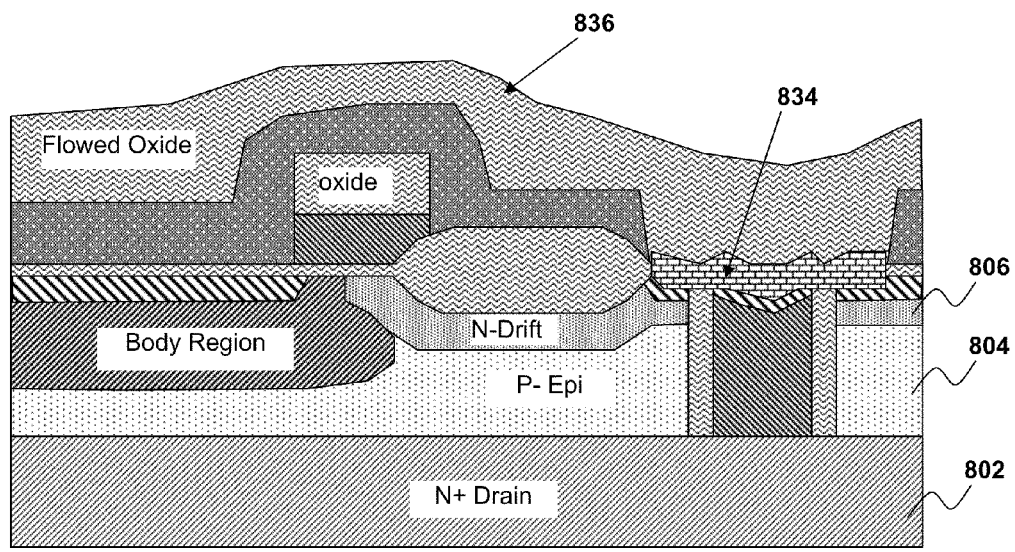

As shown in FIG. 8K, a LTO deposition and BPSG deposition are performed over the oxide layer 832 and silicide strap 834 following with the flow and densification at a temperature of about 800° C.-900° C. to prevent the damage of the silicide strap 834 and to form oxide layer 836.

Figure 8L:
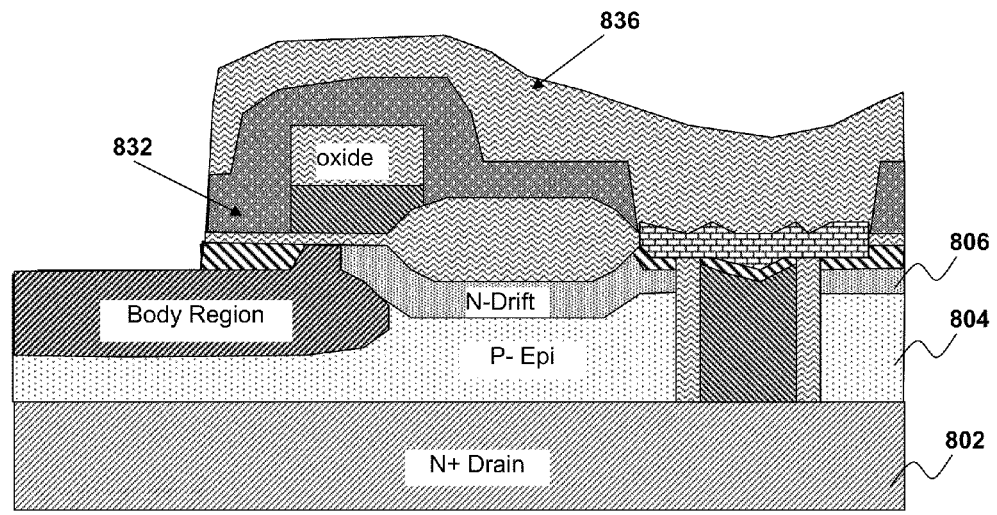

A source/body contact mask including gate electrode contact opening is deposited over the oxide layer 836 (not shown). The oxide layer 836 is etched with the end point at the top surface of the P-Epi layer 804 as shown in FIG. 8L. Optionally, a wet etch may be used to form a wine-cup shaped contact opening. The P-Epi layer 804 may optionally be etched to form a trench contact. P+ dopants, such as Boron, may then be implanted to form body contact. For example, $BF_2$ may be implanted at a dosage of $5 \times 10^{14}/cm^3$ to $2 \times 10^{15}/cm^3$ at an energy of 40 KeV to 80 KeV and zero tilt or $^{11}B$ may be implanted at a dosage of $5 \times 10^{14}/cm^3$ to $2 \times 10^{15}/cm^3$ at an energy of 40 KeV to 80 KeV and zero tilt. The Boron contact may then be annealed using rapid thermal processing with optional reflow to smooth the top corners.

Figure 8M:
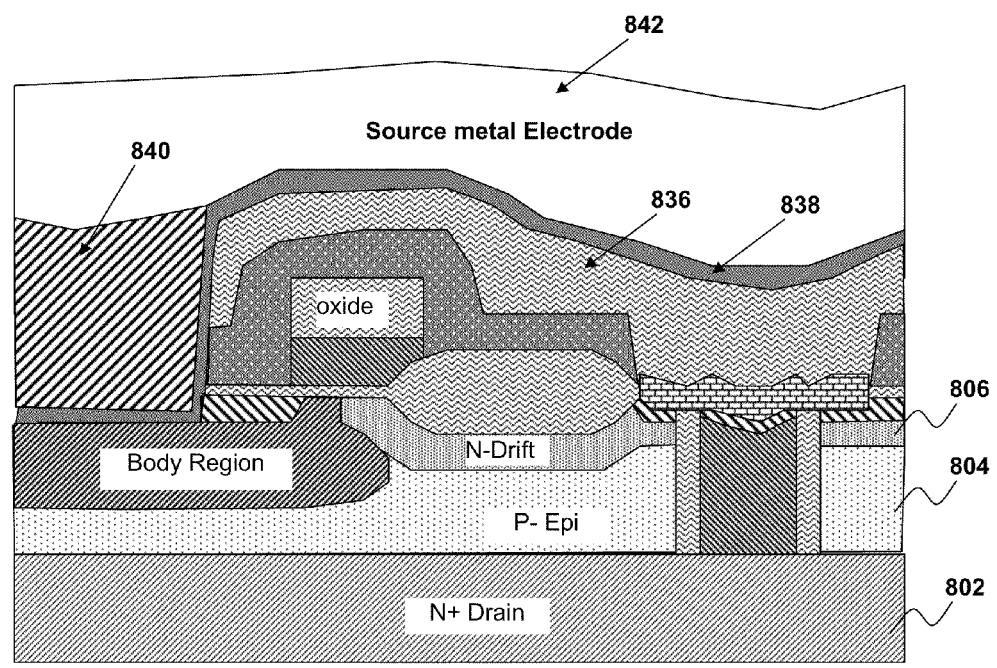

A barrier metal layer 838 is deposited over the oxide layer 836 as shown in FIG. 8M. Barrier metal can be Ti/TiN. A metal (e.g., Tungsten) plug 840 is optionally deposited and then etched back. A thick source metal layer 842 is deposited over the plug 840 and barrier metal layer 838. The source metal layer 840 may include Al with a thickness of about 1 μm to 5 μm. The top of the device may be completed with an optional passivation.

FIGS. 9A-9M are cross-sectional views illustrating the steps of a fifth method for making a LDMOS device of the type depicted in FIG. 3A.

Figure 9A:
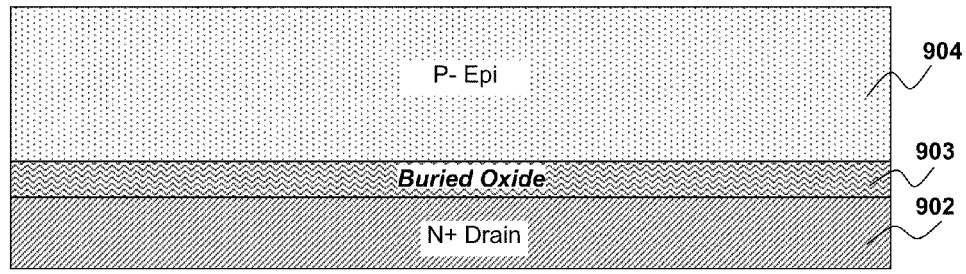
FIGS. 9A-9M are cross-sectional views illustrating the steps of a method of making a lateral DMOS device of the type depicted in FIG. 3A.

As shown in FIG. 9A, a starting material consists of a N+ substrate 902 that may include dopants, such as Arsenic, and may have 3 to 5 mOhm-cm resistivity or lower if available. The substrate 902 may have <100> crystal orientation with a standard prime. A buried insulating (e.g., oxide) layer 903 may be deposited on top of the N+ substrate 902. The thickness of the buried layer 903 may be about 0.2 μm to 0.7 μm. A P-Epi layer 904 is formed on top of the buried oxide layer 903. The P-Epi layer 904 may have a thickness of about 1 μm to 7 μm and a low doping dosage of about $5 \times 10^{14}/cm^3$ to $5 \times 10^{15}/cm^3$, preferably about $1 \times 10^{15}/cm^3$ for 20-60V applications.

Figure 9B:
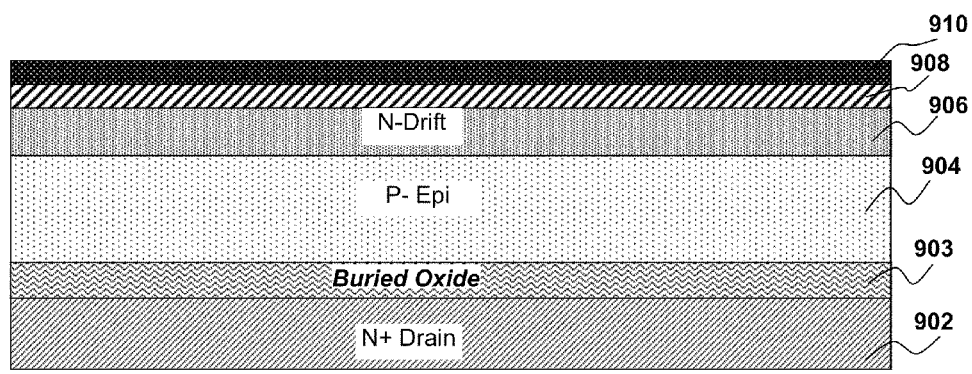

A pad oxide 908 with a thickness in the range of about 150 Å to about 450 Å is deposited on top of the P-Epi layer 904 as shown in FIG. 9B. Optional alignment layers can be formed on the wafer surface by patterning an optional Zero mask followed by a shallow silicon etch (typically around 1000 Å-2000 Å). N-type dopants, preferably Phosphorus with a dosage of about $2 \times 10^{12}/cm^3$ to $5 \times 10^{13}/cm^3$, may be implanted on the top surface of the P-Epi layer 904 to form an N-drift layer 906. An optional nitride layer 910 can now be deposited on the wafer surface and patterned using an optional Active area mask to form an optional field oxide using LOCOS. The thickness of the nitride layer is preferably between 750 Å and 2KÅ. Following the deposition of an active area mask (not shown) on top of the nitride layer 910, which is optional, the etching of the nitride layer 910 from non-active region is performed and the resist is then stripped. Field oxidation can be optionally performed at this point.

Figure 9C:
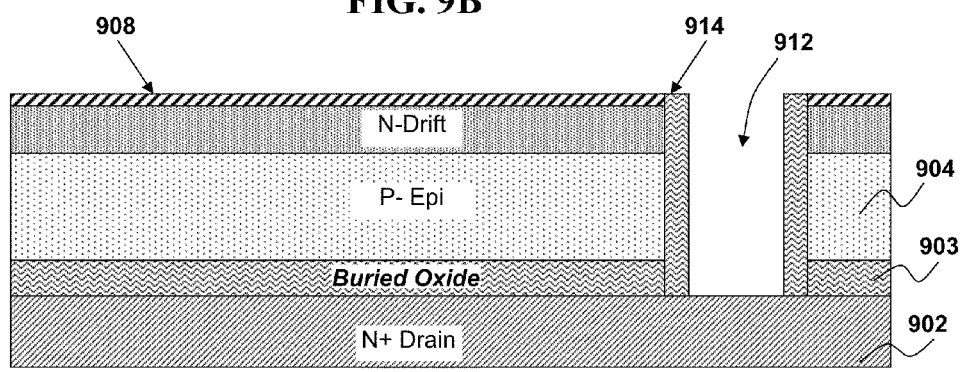

The nitride layer 910 is then stripped as shown in FIG. 9C. A drain trench mask is applied on top of the structure (not shown). A drain trench 912 is formed by etching the oxide pad 908, the N-drift layer 906 and the P-Epi layer 904. The drain trench mask is then stripped. A unique silicon round hole etch, e.g., an isotropic silicon etch, may be carried out to round off the trench bottom corners. Conformal oxide deposition is performed in the trench 912 following with a vertical etching of oxide to form oxide spacers 914 on the side walls of the trench 912 using reactive-ion-etching (RIE) for example. N+ dopants may optionally be implanted at the bottom of the drain trench 912.

Figure 9D:
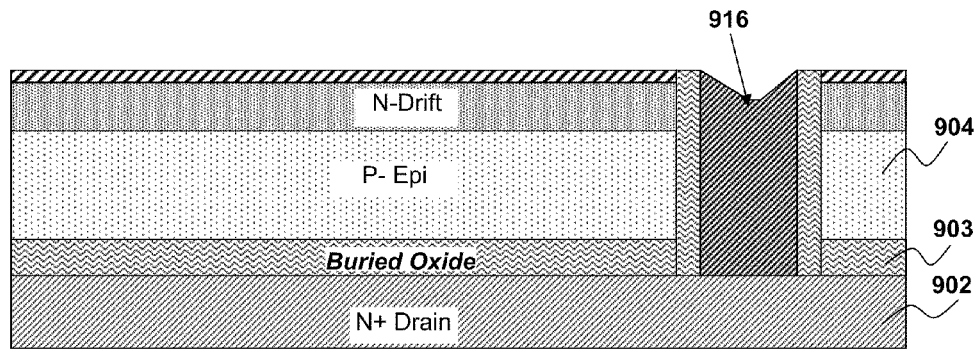

As shown in FIG. 9D, a conductive material (e.g., N+ polysilicon) is deposited in the drain trench 912 to form drain contact 916. If polysilicon is not deposited in-situ doped, the polysilicon can be doped using high dose ion implantation, or pre-deposition using POCL3 diffusion, for example. The conductive material forming the drain contact 916 may then be etched back until the conductive material is removed from the horizontal wafer surfaces, i.e., the end point of the etching back is on the top surface of the oxide pad 908 with perhaps a slight over etch.

Figure 9E:
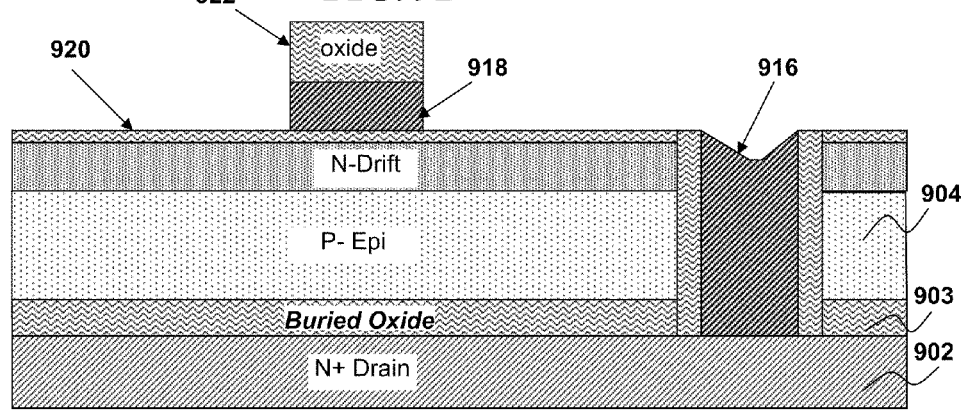

The thin pad oxide 908 is then stripped as shown in FIG. 9E. A sacrificial oxide is formed on top of the N-drift layer 906 and then is stripped followed by the growing of a gate oxide layer 920. Conductive material, e.g., polysilicon, may be deposited on top of the gate oxide layer 920 to form a gate 918. The thickness of the gate 918 may be about 1KÅ to 6KÅ. Polysilicon for the gate 918 may be doped with N+ dopant using either in-situ doping or ion implantation into the polysilicon forming the gate 918. An oxide layer 922 may be deposited on top of the gate 918. The oxide layer 922 preferably includes a low temperature oxide (LTO), such as plasma-enhanced tetraethylorthosilicate (PETEOS) with a thickness of about 1KÅ to 5KÅ. A gate mask (not shown) is applied on top of the oxide layer 922 following with the etching of the oxide layer 922 and the gate 918.

Figure 9F:
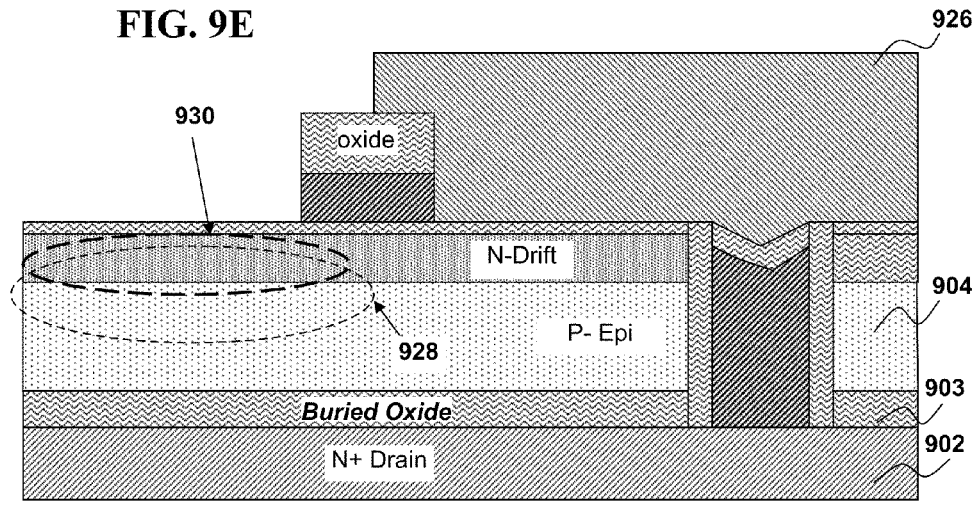

As shown in FIG. 9F, a body photoresist mask 926 is applied on top of the structure to define the edge of the body region and is retained on the drain structure during subsequent formation of the deep body implant 928. The deep body implant 928 controls JFET pinching by compensating the drift towards the drain side of the gate. By way of an example, the deep body implant can be performed using $^{11}B$ at a dosage of about $1 \times 10^{13}/cm^3$ to $5 \times 10^{14}/cm^3$, zero tilt, and an energy of about 100 KeV to 650 KeV or at a dosage of $1 \times 10^{13}/cm^3$ to $5 \times 10^{14}/cm^3$, multiple titled implants with rotation and with an energy of about 100 KeV to 650 KeV. After the deep implant, a shallow body implant 930, which controls the channel, is formed. By way of an example, the shallow body implant can be performed using $^{11}B$ at a dosage of about $3 \times 10^{13}/cm^3$ to $2 \times 10^{14}/cm^3$, zero tilt and an energy of 20 KeV to 60 KeV.

Figure 9G:
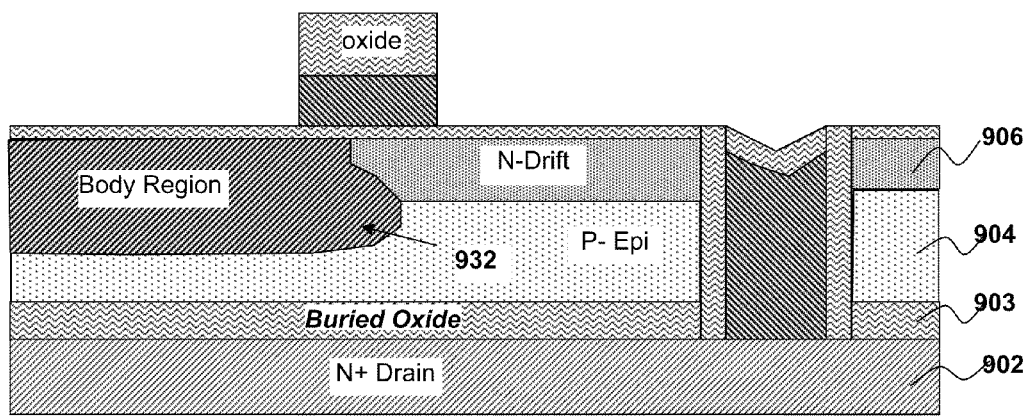

As shown in FIG. 9G, the photoresist mask 926 is then removed, using a wet etch for example. A drive-in step, for example 20-120 minutes at 1000-1150 degrees Centigrade, with slight $O_2$ during load and $N_2$ during drive-in, is performed to diffuse the p type implants in body region 932.

Figure 9H:
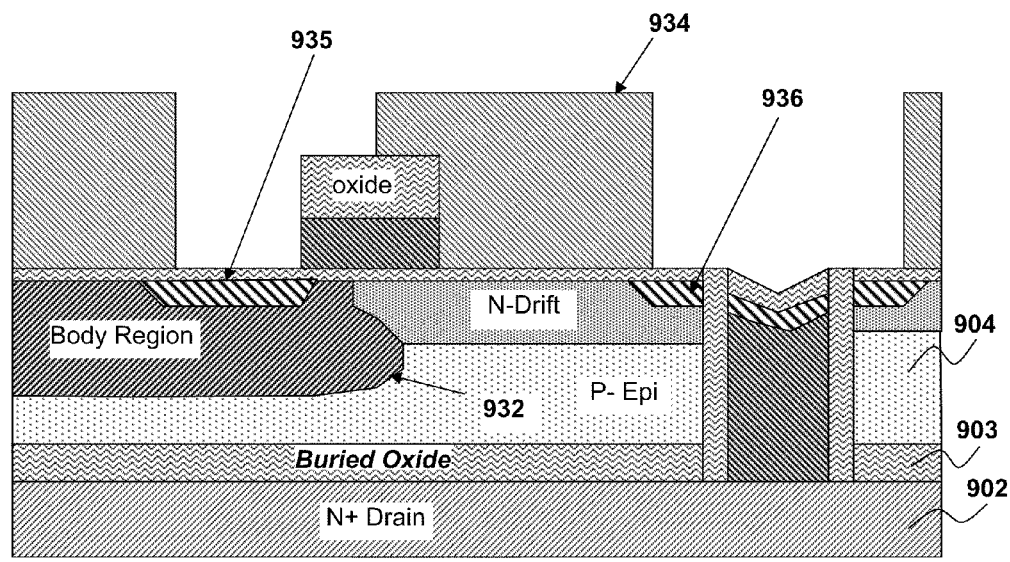

As shown in FIG. 9H, a source/drain contact photoresist mask 934 is deposited over the gate oxide layer 920 and oxide cap 922. N+ dopants may be implanted to form an N+ source region 935 and an N+ drain contact region 936. By way of an example, Arsenic can be implanted at 50 KeV-150 KeV with a dosage of about $2 \times 10^{15}/cm^3$ to $1 \times 10^{16}/cm^3$ and zero tilt.

Figure 9I:
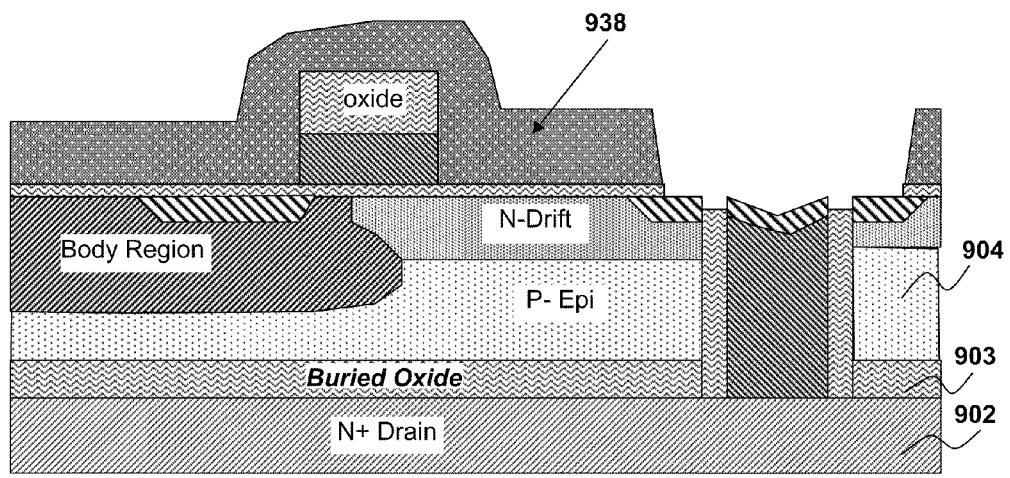

As shown in FIG. 9I, photoresist mask 934 is then removed and N+ source contact region 935 and N+ top drain contact regions 936 are annealed. An oxide layer 938 is deposited over the surface of the oxide layers 920 and 922. The oxide layer 938 can be LTO, or LTO and Borophosphosilicate glass (BPSG) with reflow or PETEOS. A drain contact mask (not shown) is deposited over the oxide layer 938 following with the etching of the oxide layer 938.

Figure 9J:
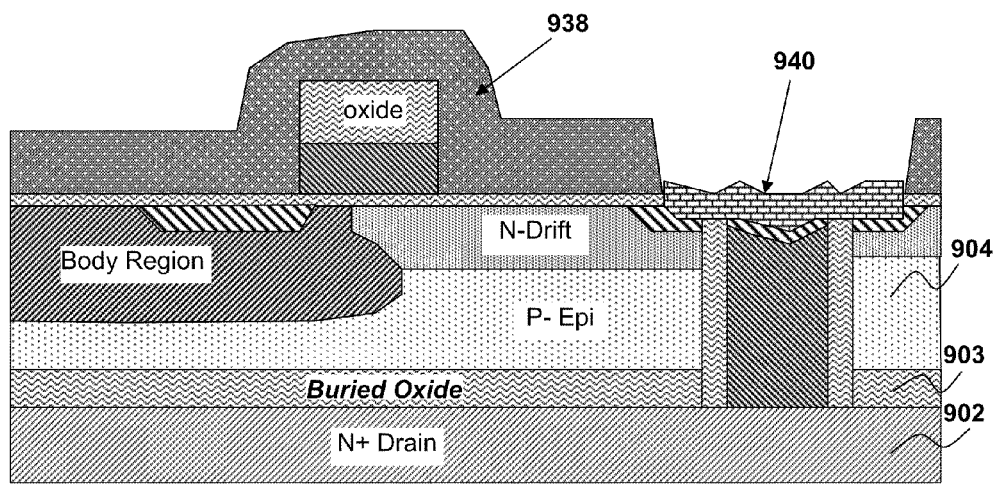

As shown in FIG. 9J, a silicide strap 940 is formed on top of the top drain contact regions 936. The silicide may be formed, e.g., by Ti deposition and rapid thermal annealing (RTA) process under nitrogen atmosphere, at 650° C. to 700° C. in 30-60 seconds. The thickness of the Ti layer is about 300 Å to 1000 Å. The resulting TiN layer is then etched, for example salicide wet etch. $TiSi_x$ is formed with a RTA process under nitrogen atmosphere, at 800° C. to 900° C.

Figure 9K:
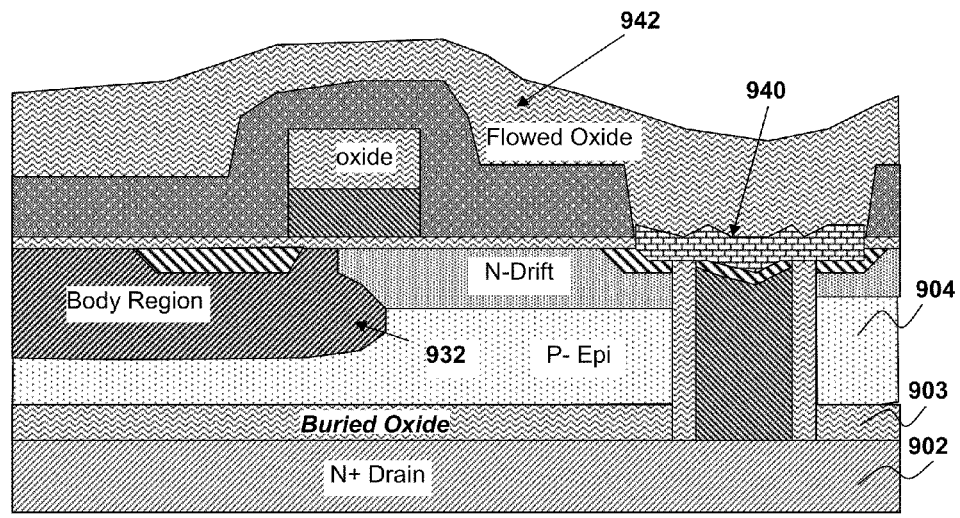

As shown in FIG. 9K, a LTO deposition and BPSG deposition are performed over the oxide layer 938 and silicide strap 940 following with the flow and densification at a temperature of about 800° C.-900° C. to prevent the damage of the silicide strap 940 and to form oxide layer 942.

Figure 9L:
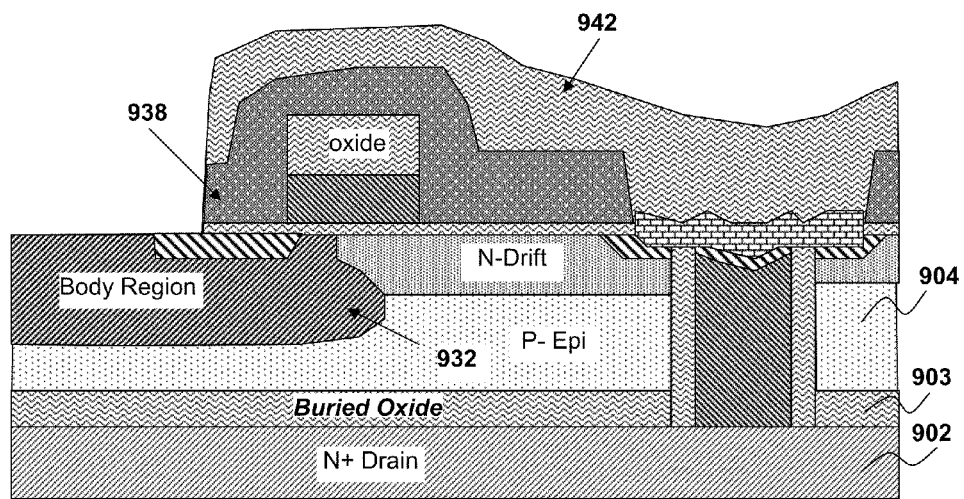

A source/body contact mask including gate electrode contact opening is deposited over the oxide layer 942 (not shown). Oxide layer 942 is etched with the end point at the top surface of the P-Epi layer 904 as shown in FIG. 9L. Optionally, wet etch is used to a form wine-cup shaped contact opening. The P-Epi layer 904 is optionally etched to form trench contact. P+ dopant, such as Boron, is then implanted to form body contact. For example, $BF_2$ is implanted at a dosage of $5 \times 10^{14}/cm^3$ to $2 \times 10^{15}/cm^3$ at an energy of 40 KeV to 80 KeV and zero tilt or $^{11}B$ at a dosage of $5 \times 10^{14}/cm^3$ to $2 \times 10^{15}/cm^3$ at an energy of 40 KeV to 80 KeV and zero tilt. The Boron contact is then annealed using rapid thermal processing with optional reflow to smooth the top corners.

Figure 9M:
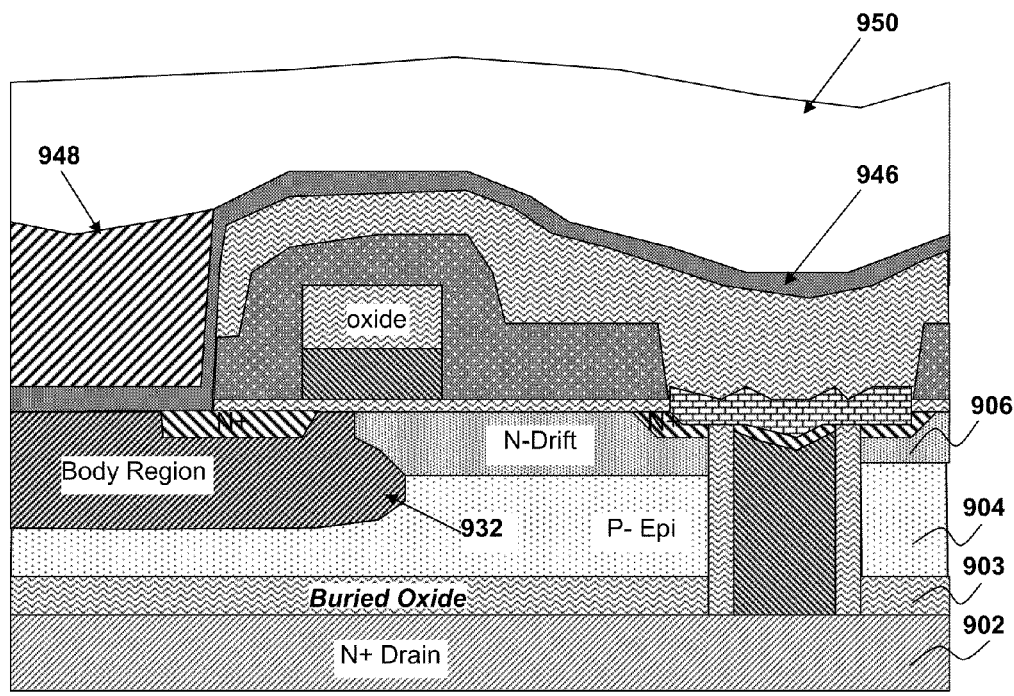

A barrier metal layer 946 is deposited over the oxide layer 942 as shown in FIG. 9M. Barrier metal can be Ti/TiN. A metal, e.g., Tungsten, plug 948 is optionally deposited and then etched back. A thick source metal layer 950 is deposited over the plug 948 and barrier metal layer 946. The source metal layer 950 may include Al with a thickness of about 1 um to 5 um. The device is completed with an optional passivation.

Figure 10:
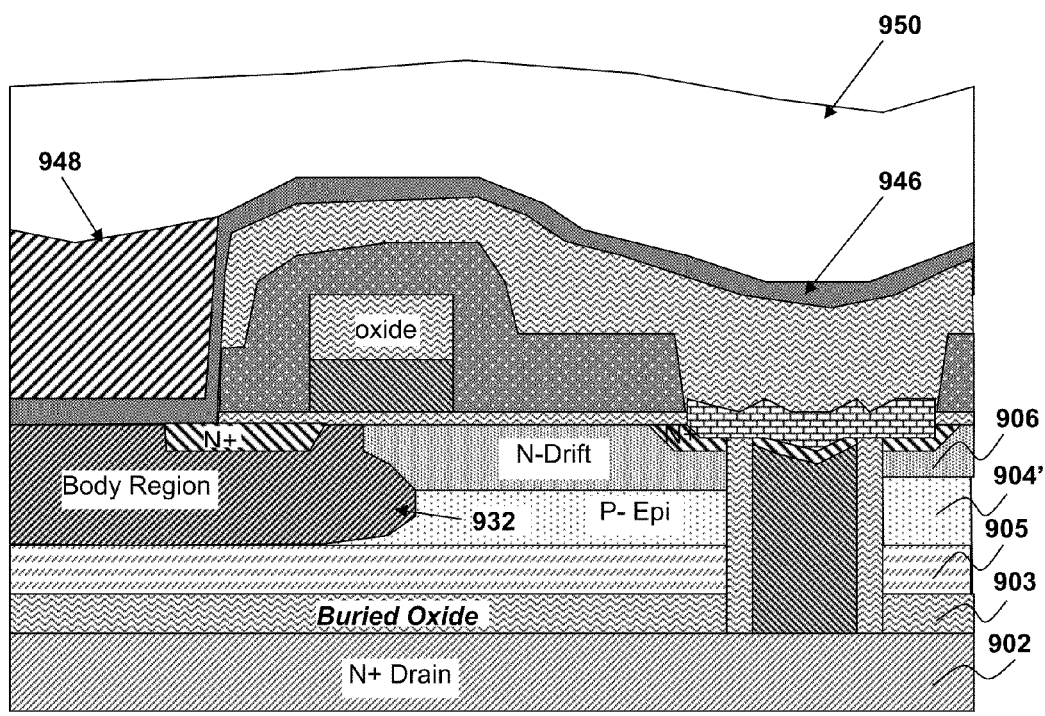
FIG. 10 is a cross-sectional view of a variation on a DMOS device of the type shown in FIG. 9M.

In an alternative embodiment, the P-Epi layer 904 can be replaced with a P− on P+ structure. FIG. 10 is similar to FIG. 9M except that the P-epi layer 904 is replaced by P+ layer 905 under a P− epi layer 904'. Though not shown, in all of the embodiments above a metal layer may be formed on the bottom of the N+ substrate, i.e., the backside of the wafer, to form a bottom drain electrode.

While the above is a complete description of the preferred embodiment of the present invention, it is possible to use various alternatives, modifications and equivalents. For example, though the embodiments above show an n-channel MOSFET, the invention would also work for a p-channel MOSFET—the doping conductivity type of each layer and region would simply be reversed with respect to that described above. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forming a semiconductor device comprising:
   a) providing a start material comprising a semiconductor substrate and a semiconductor epitaxial layer disposed on top of the substrate, wherein the substrate and epitaxial layer are of opposite conductivity types;
   b) forming a drift layer at a top portion of the epitaxial layer, wherein the drift layer has the same conductivity type as the substrate;
   c) depositing a nitride layer on top of a surface of the semiconductor epitaxial layer;
   d) etching the nitride layer at non-active region;
   e) forming field oxide regions in drift-drain extension regions;
   f) forming a drain contact trench in the drift layer and the epitaxial layer;
   g) forming insulating spacers along sidewalls of the drain contact trench;
   h) filling the drain contact trench with an electrically conductive drain plug;
   i) forming a gate dielectric layer on top of the drift layer;
   j) forming a conductive gate on top of the gate dielectric layer;
   k) forming a body region at a top portion of the epitaxial layer, so that a portion of the body region is under the gate;
   l) implanting dopants into a top portion of the drift layer to form a source region and a top drain contact, wherein the source region and the top drain contact have the same conductivity type as the substrate; and
   m) forming an electrically conductive drain strap on top of the drain plug.

2. The method of claim 1 wherein a) further comprises forming a buried insulating layer on top of the substrate and under the epitaxial layer.

3. The method of claim 2 wherein a) further comprises forming a doped layer of a conductivity type opposite that of the substrate on top of the buried insulating layer and under the epitaxial layer.

4. The method of claim 1 wherein forming a body region comprising:
   forming a deep body implant in the epitaxial layer; and
   forming shallow body implant in the epitaxial layer, wherein a portion of the shallow body implant is located under the gate to form the channel region.

5. The method of claim 1 wherein the drain plug comprises polysilicon.

6. The method of claim 5, wherein the drain strap is made of silicide.

7. The method of claim 1, wherein forming the drain strap comprising:
   forming a barrier metal layer on top of the drain plug; and
   forming a tungsten plug on top of the barrier metal layer.

8. The method of claim 1, wherein the drain plug comprises tungsten.

9. The method of claim 8 further comprising forming a barrier metal layer on the sidewalls and a bottom of the drain contact trench before filling the drain contact trench with tungsten.

10. The method of claim 1, wherein step f) though step) i) are performed after step b) and before step c).

11. A method for forming a semiconductor device comprising:
   a) providing a start material comprising a semiconductor substrate and a semiconductor epitaxial layer disposed on top of the substrate, wherein the substrate and epitaxial layer are of opposite conductivity types;
   b) forming a drift layer at a top portion of the epitaxial layer, wherein the drift layer has the same conductivity type as the substrate;
   c) forming a drain contact trench in the drift layer and the epitaxial layer;
   d) forming insulating spacers along sidewalls of the drain contact trench;
   e) filling the drain contact trench with an electrically conductive drain plug;
   f) forming a gate dielectric layer on top of the drift layer;
   g) forming a conductive gate on top of the gate dielectric layer;
   h) forming a body region at a top portion of the epitaxial layer, so that a portion of the body region is under the gate;
   i) implanting dopants into a top portion of the drift layer to form a source region and a top drain contact, wherein the source region and the top drain contact have the same conductivity type as the substrate; and j) forming an electrically conductive drain strap on top of the drain plug, wherein forming the drain strap comprising:

forming a barrier metal layer on top of the drain plug; and
forming a tungsten plug on top of the barrier metal layer.

12. The method of claim 11 wherein a) further comprises forming a buried insulating layer on top of the substrate and under the epitaxial layer.

13. The method of claim 12 wherein a) further comprises forming a doped layer of a conductivity type opposite that of the substrate on top of the buried insulating layer and under the epitaxial layer.

14. The method of claim 11, further comprising after b) and before c):

depositing a nitride layer on top of a surface of the semiconductor epitaxial layer;
etching the nitride layer at non-active regions; and
forming field oxide regions in drift-drain extension regions.

15. The method of claim 11 wherein forming a body region comprising:

forming a deep body implant in the epitaxial layer; and
forming shallow body implant in the epitaxial layer, wherein a portion of the shallow body implant is located under the gate to form the channel region.

16. The method of claim 11 wherein the drain plug comprises polysilicon.

17. The method of claim 16, wherein the drain strap is made of silicide.

18. The method of claim 11, wherein the drain plug comprises tungsten.

19. The method of claim 18, further comprising forming a barrier metal layer on the sidewalls and a bottom of the drain contact trench before filling the drain contact trench with tungsten.

20. The method of claim 11, wherein step f) though step i) are performed after step b) and before step c).

* * * * *